(12) United States Patent
Takeoka et al.

(10) Patent No.: US 7,613,972 B2
(45) Date of Patent: Nov. 3, 2009

(54) SEMICONDUCTOR INTEGRATED CIRCUIT, AND DESIGNING METHOD AND TESTING METHOD THEREOF

(75) Inventors: Sadami Takeoka, Osaka (JP); Shinichi Yoshimura, Osaka (JP)

(73) Assignee: Panasonic Corporation, Osaka (JP)

( * ) Notice: Subject to any disclaimer, the term of this patent is extended or adjusted under 35 U.S.C. 154(b) by 357 days.

(21) Appl. No.: 11/585,778

(22) Filed: Oct. 25, 2006

(65) Prior Publication Data

US 2007/0113131 A1 May 17, 2007

(30) Foreign Application Priority Data

Oct. 25, 2005 (JP) ............................. 2005-310178

(51) Int. Cl.
*G01R 31/28* (2006.01)
(52) U.S. Cl. ....................................... 714/731; 714/726
(58) Field of Classification Search ....................... None
See application file for complete search history.

(56) References Cited

U.S. PATENT DOCUMENTS

| | | | |
|---|---|---|---|
| 5,524,114 A * | 6/1996 | Peng ........................... | 714/724 |
| 5,627,841 A | 5/1997 | Nakamura | |
| 6,442,722 B1 | 8/2002 | Nadeau-Dostie et al. | |
| 2005/0283696 A1 * | 12/2005 | Warren et al. ............... | 714/742 |

FOREIGN PATENT DOCUMENTS

| | | |
|---|---|---|
| JP | 08-105941 | 4/1996 |
| JP | 2002-196046 | 7/2002 |
| JP | 2003-014822 A | 1/2003 |
| JP | 2003-150658 | 5/2003 |
| JP | 2005-085206 | 3/2005 |
| WO | WO 00/19343 | 4/2000 |

OTHER PUBLICATIONS

Japanese Office Action, with English translation, issued in Japanese Patent Application No. 2005-310178, mailed May 12, 2009.

* cited by examiner

*Primary Examiner*—Kevin L Ellis
*Assistant Examiner*—Guerrier Merant
(74) *Attorney, Agent, or Firm*—McDermott Will & Emery LLP

(57) ABSTRACT

A semiconductor integrated circuit comprises a combinational circuit section having a combinational circuit, a scan path circuit for inputting and outputting a value from and to the combinational circuit section in accordance with a scan enable signal and in synchronization with a clock signal, and a clock control section for generating and outputting a predetermined number of pulses as the clock signal after a predetermined period has passed since a time when an output command signal was received. The clock control section has an oscillator circuit for generating and outputting the pulse, and is configured to output a last pulse of the predetermined number of pulses in a manner which holds a logical value immediately after an active edge for the scan path circuit.

17 Claims, 26 Drawing Sheets

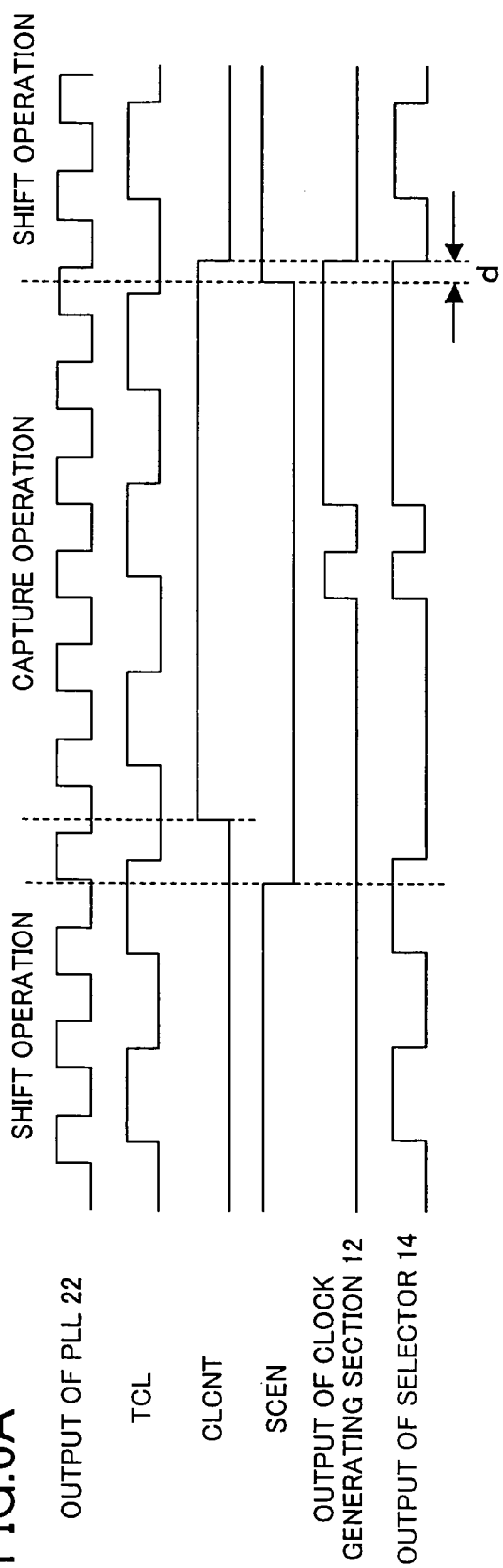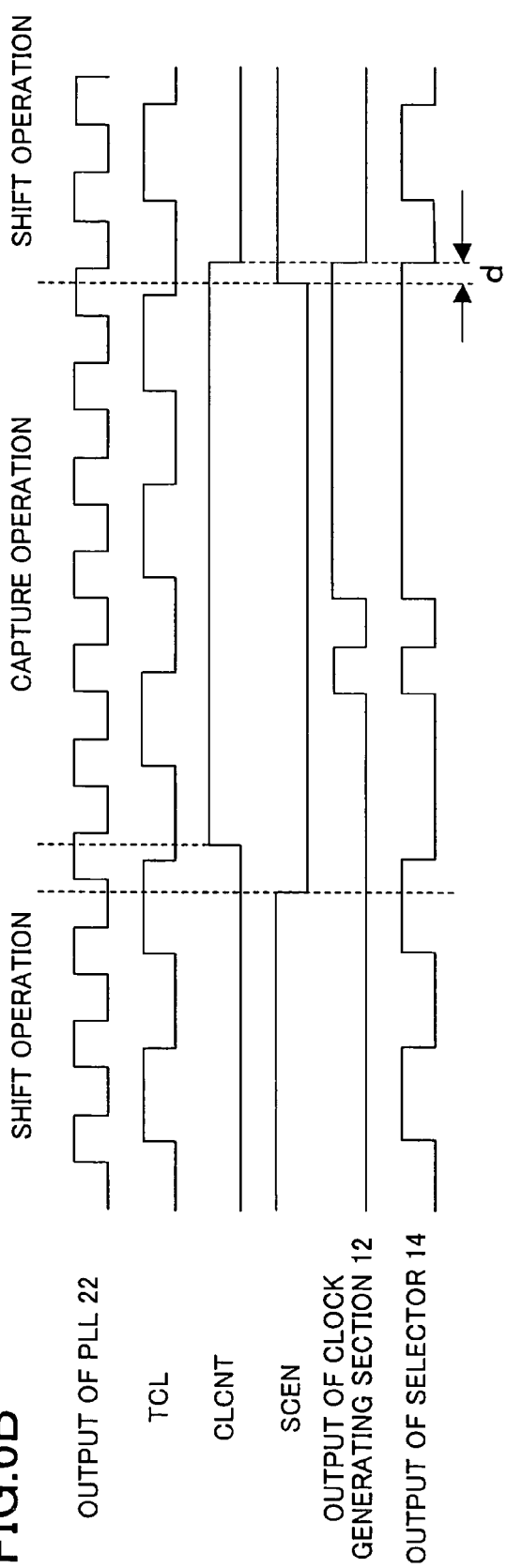

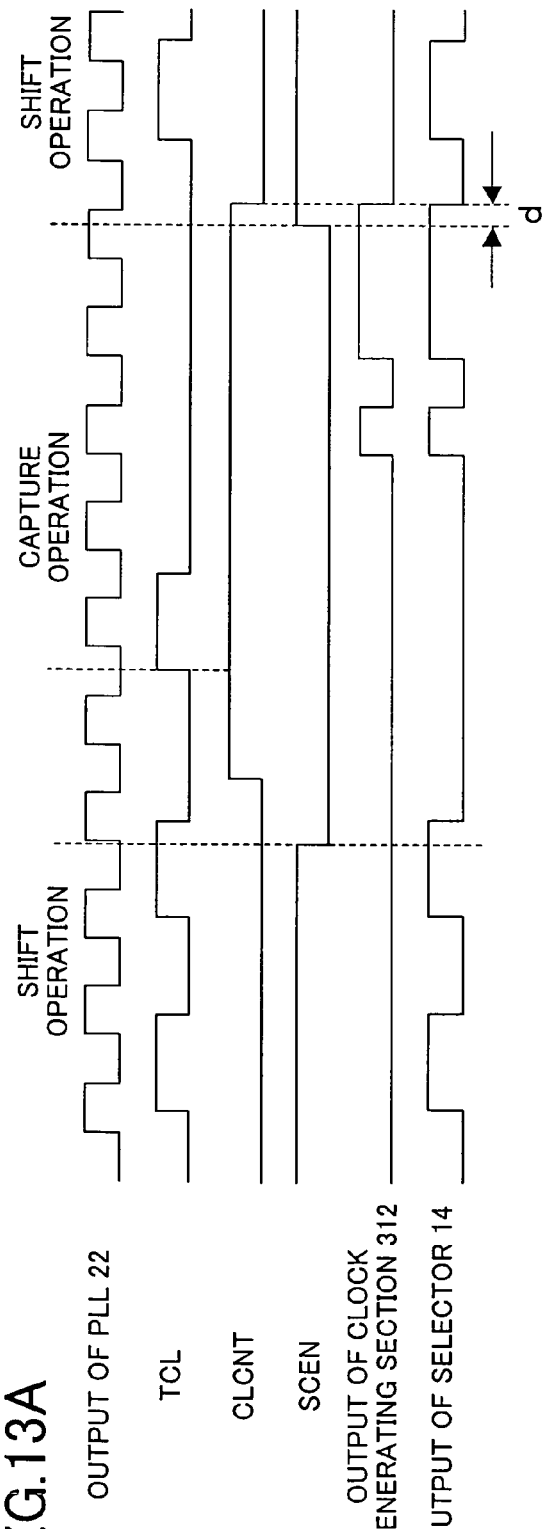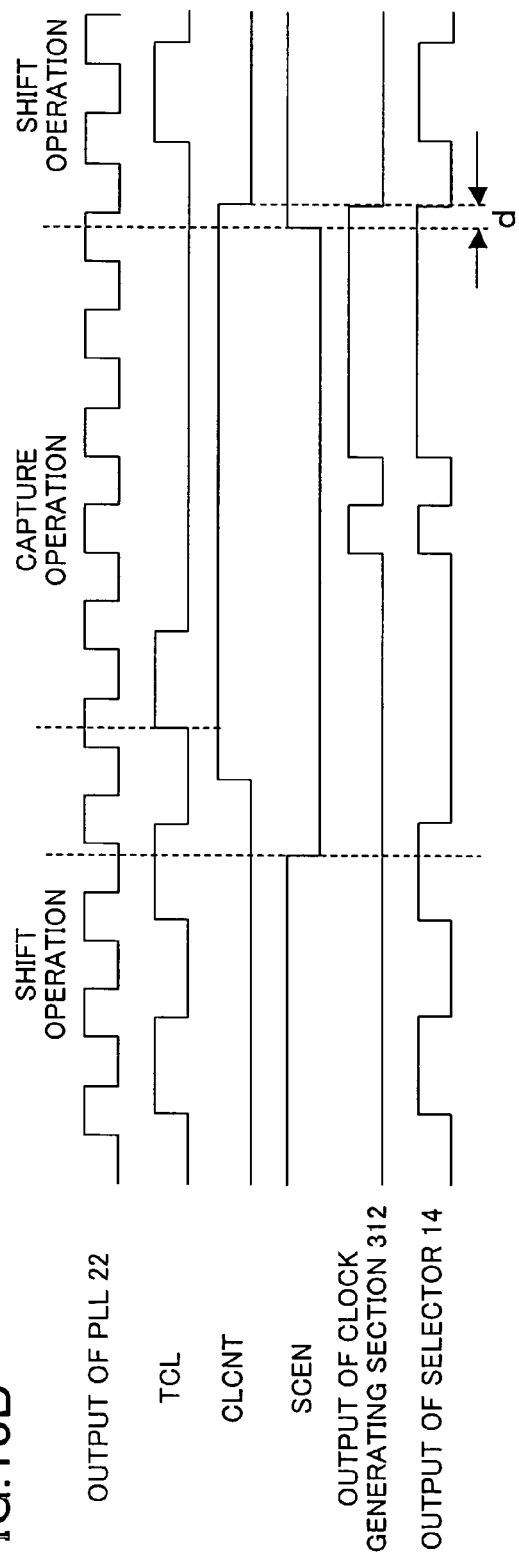

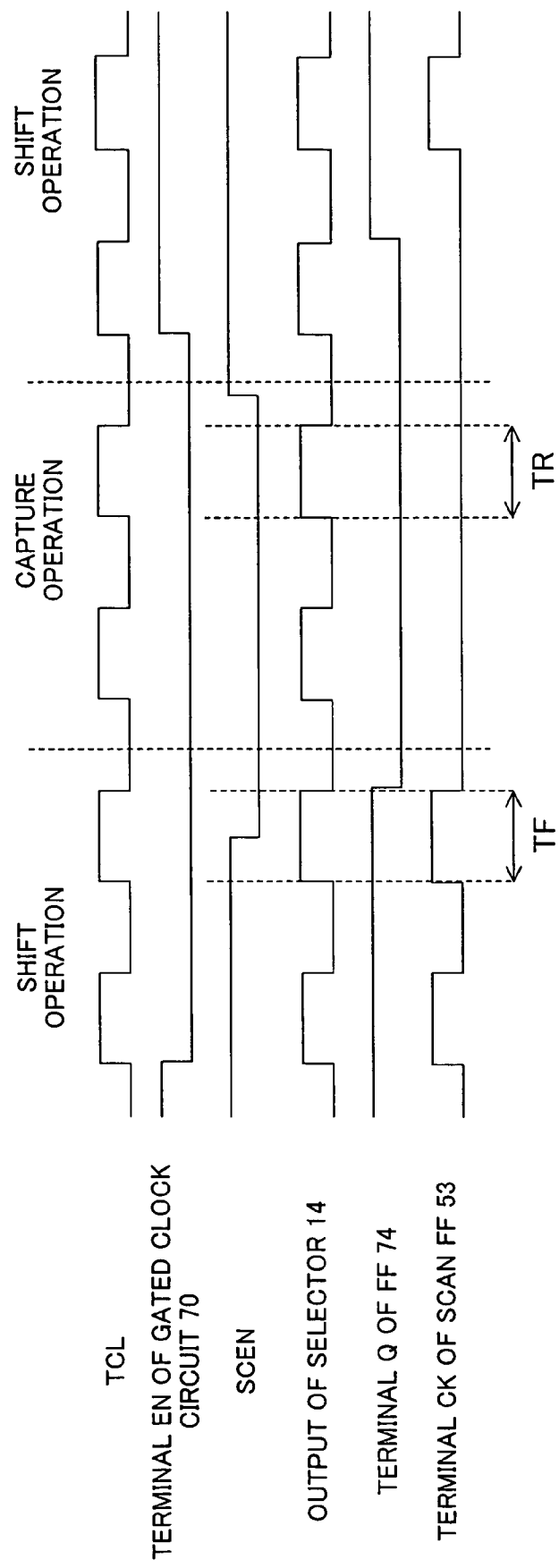

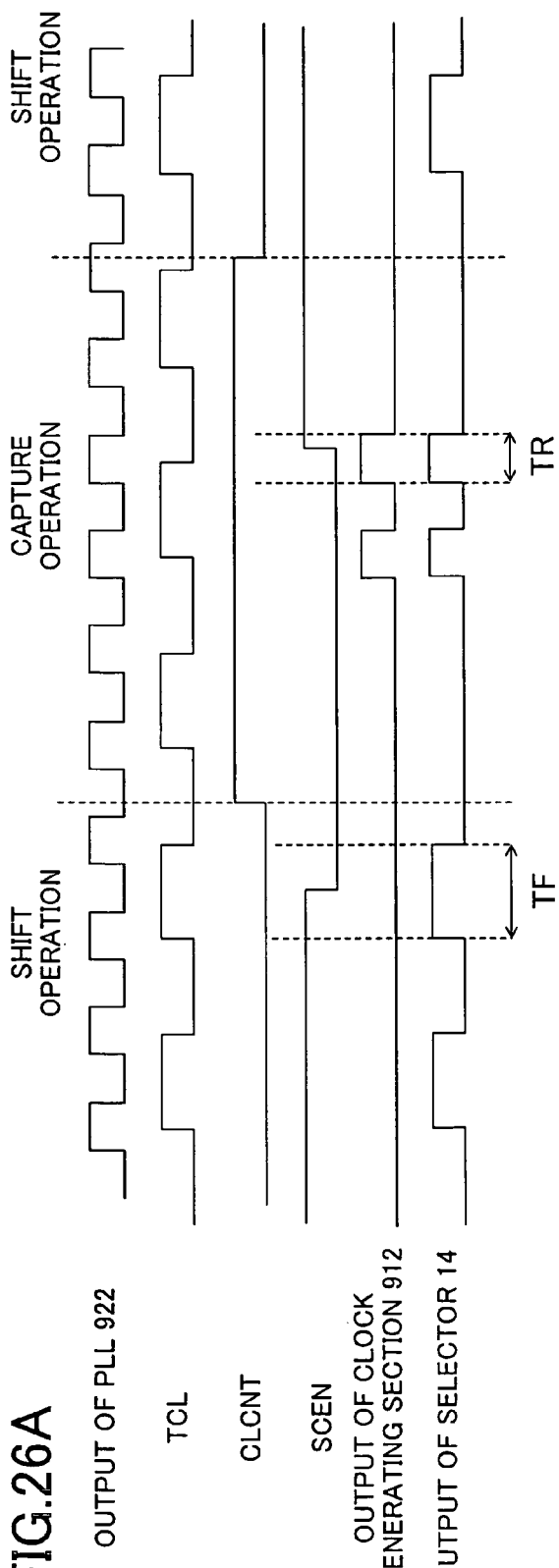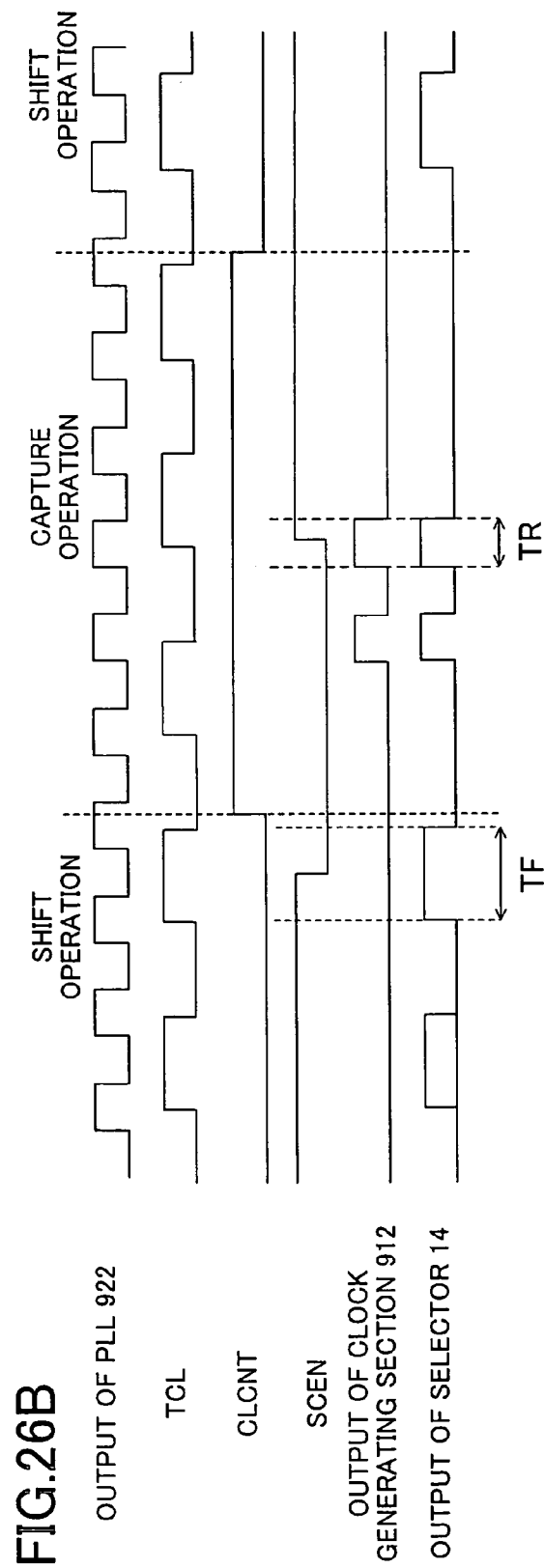

SEMICONDUCTOR INTEGRATED CIRCUIT, AND DESIGNING METHOD AND TESTING METHOD THEREOF

BACKGROUND OF THE INVENTION

The present invention relates to a semiconductor integrated circuit, and a designing method and a testing method thereof, and more particularly, to a technique for improving the quality of a test.

In recent years, the scale and complexity of semiconductor integrated circuits are rapidly increased with rapid progress in technology for nanometer semiconductor manufacturing process. Due to this, it is increasingly difficult to test semiconductor integrated circuits. To address this problem, a designing method which employs a scan test, a Built-in Self Test (BIST), or the like has been developed as a means for facilitating a test of a semiconductor integrated circuit. Since such a method has been widespread, faults represented by the stuck-at fault model can be efficiently tested. When faults represented by the stuck-at fault model are detected, the capability to detect the fault does not depend on the clock frequency. Therefore, when a conventional scan test is performed, a clock signal having a frequency lower than a clock frequency used when a semiconductor integrated circuit is actually used (actual operation) is generally used.

However, when a clock signal having a high frequency is used during an actual operation, an operational failure increasingly often occurs in a semiconductor integrated circuit with advances in nanometer technology for semiconductor integrated circuits. This is because, for example, a small defect is likely to emerge in nanometer semiconductor elements and wirings; a variation in quality occurring due to a variation in each manufacturing process of semiconductor integrated circuits becomes obvious when a clock signal having a high frequency is used; manufacturing steps are complicated; and the like. However, the conventional scan test is insufficient to test such an operational failure depending on the clock frequency. Therefore, a test method which employs a clock signal having the same frequency as that used during an actual operation (e.g., delay testing, BIST, etc.) needs to be required.

The delay testing is generally performed using the scan test technique. In the scan test technique, two operating modes, i.e., a shift operating mode and a normal operating mode, are performed in combination. To detect a fault represented by the stuck-at fault model, one pulse may be input in a normal operating mode when the conventional scan test is performed. However, in a normal operating mode of the delay testing, it is necessary to input two pulses, and the two pulses need to have the same clock frequency as that used during an actual operation. Also, when BIST is performed, it is necessary to input a pulse having a clock frequency which is actually used for a semiconductor integrated circuit, to a semiconductor integrated circuit including a BIST circuit so as to test a failure depending on the clock frequency.

To satisfy the above-described requirements, a circuit (e.g., a tester) for supplying a test clock signal having a predetermined clock frequency is additionally provided outside a semiconductor integrated circuit, even when an oscillator circuit (e.g., a Phase Locked Loop (PLL)) which is used during an actual operation is built in the semiconductor integrated circuit. When a test is performed, a test clock signal supplied from an external tester is selected using a selector or the like instead of a signal from the oscillator circuit.

However, as the speed of semiconductor integrated circuits is increased, it is becoming considerably difficult to externally supply a test pulse having the same frequency as that used during an actual operation. For example, assuming that the clock frequency of a semiconductor integrated circuit is 1 GHz during an actual operation, when delay testing or BIST which employs a clock signal having the same clock frequency as that used during the actual operation is performed with respect to the semiconductor integrated circuit, a high-speed tester which can supply a test clock signal having a frequency of 1 GHz is required. However, actually, the high-speed tester which can supply a clock signal having a frequency of 1 GHz is considerably expensive, leading to an increase in cost. Therefore, as a method for solving this problem, a method is known in which, when a high clock frequency is required for a test, a pulse output from an oscillator circuit inside a semiconductor integrated circuit is utilized (JP 2003-14822 A).

In recent years, semiconductor integrated circuits have increasingly demanded designs for low power consumption, and therefore, it is often that a clock stop control circuit for controlling an operation or a stop of a clock signal, which is generally called a gated clock circuit, is provided on a clock line. A conventional problem with semiconductor integrated circuits comprising the gated clock circuit will be described with reference to the accompanying drawings.

FIG. 1 is a block diagram illustrating an exemplary semiconductor integrated circuit. FIG. 23 is a block diagram illustrating a configuration of a conventional clock generating section 912. Hereinafter, an operation during a test of the semiconductor integrated circuit of FIG. 1 in which the clock generating section 912 is used instead of a clock generating section 12 (referred to as a conventional semiconductor integrated circuit) will be described. The semiconductor integrated circuit comprises a clock control section 10, a combinational circuit section 40, scan flip-flops 51, 52, 53 and 54, and a gated clock circuit 70. FIG. 4 is a block diagram illustrating an exemplary configuration of the gated clock circuit 70 of FIG. 1.

Firstly, an example of scan delay testing which is a most commonly used conventional technique and employs only an externally supplied clock signal for a test, will be described. Initially, the value of a clock switch terminal CLS is fixed to 1. Thereby, the selector 14 selects a clock signal supplied from an external tester to a test clock terminal TCL. Therefore, the signal of the clock generating section 912 is not used, and the externally supplied clock signal is used for the subsequent test operation.

The delay testing is performed mainly by a shift operation and a capture operation, as is similar to a general scan test for a stuck-at fault. The delay testing is different from the stuck-at fault scan test only in that a plurality of pulses (generally, two) are used during the capture operation rather than a single clock pulse. The shift operation and the capture operation are switched in accordance with a signal of a scan enable terminal SCEN. It is here assumed that the shift operation is performed when the value of the scan enable terminal SCEN is 1, and the capture operation is performed when the value of the scan enable terminal SCEN is 0.

Since a clock signal needs to be supplied to all the scan flip-flops during the shift operation, a clock signal needs to be output from an output terminal GCK of the gated clock circuit 70 which controls a clock signal to the scan flip-flop 53. Specifically, the value of a terminal Q of a flip-flop (FF) 74 (FIG. 4) needs to be fixed to 1. On the other hand, since a normal operation is performed during the capture operation, a supply/stop control of a clock signal to the scan flip-flop 53 needs to be controlled in accordance with a signal input to a terminal EN of the gated clock circuit 70.

FIG. 24 is a timing diagram illustrating waveforms during a test of the conventional semiconductor integrated circuit, indicating the case where a requirement for the signal change timing of the scan enable terminal SCEN is satisfied. To achieve the above-described operation, the requirement for the signal change timing of the scan enable terminal SCEN is the following as illustrated in FIG. 24. Specifically, a level of the signal of the scan enable terminal SCEN needs to be 0 within a "scan enable fall request timing range TF" when the shift operation is switched to the capture operation, and needs to be 1 within a "scan enable rise request timing range TR" when the capture operation is switched to the shift operation.

FIG. 25 is a timing diagram illustrating waveforms when the conventional semiconductor integrated circuit is tested, indicating the case where the requirement for the signal change timing of the scan enable terminal SCEN is not satisfied. In FIG. 25, the case where, only when the capture operation is switched to the shift operation, the requirement for the signal change timing of the scan enable terminal SCEN is not satisfied, is illustrated.

A clock signal output from the terminal GCK of the gated clock circuit 70 during the capture operation is in a stopped state since an input value of the terminal EN is 0. Next, in the case where the capture operation is switched to the shift operation, when the signal change timing of the scan enable terminal SCEN from 0 to 1 is delayed from a fall of a second capture clock, the signal of the terminal GCK of the gated clock circuit 70 remains in the stopped state even after entering the shift operation, and this state continues until the timing of a fall of a first clock signal of the shift operation. As a result, since the first clock signal of the shift operation is not input to the scan flip-flop 53, a malfunction occurs in the shift operation.

The deviation of the signal change timing of the scan enable terminal SCEN as illustrated in FIG. 25 can be avoided by adjusting the timing of inputting a signal change from a tester to the scan enable terminal SCEN. Note that a delay occurring in a signal path from the scan enable terminal SCEN to a terminal SEN of the gated clock circuit 70, or a signal path from the scan enable terminal SCEN to terminals SE of the scan flip-flops 51 to 54, varies depending on a manufacture variation and a temperature condition during a test. Therefore, when the delay is large, or a clock frequency during a test is high, it may be difficult to avoid the deviation.

Next, an example of scan delay testing in which, in order to test a high-speed semiconductor integrated circuit, an externally supplied clock signal for a test is used during the shift operation, and a clock output by a clock generating circuit (PLL, etc.) in the semiconductor integrated circuit is used during the capture operation, will be described (JP 2003-14822 A above).

FIG. 26A is a timing diagram illustrating waveforms during a test of the conventional semiconductor integrated circuit, indicating the case where the timing of switching the value of a clock control terminal CLCNT to 1 is within a period in which the value of a pulse of a PLL 922 is 0. FIG. 26B is a timing diagram illustrating waveforms during a test of the conventional semiconductor integrated circuit, indicating the case where the timing of changing the value of the clock control terminal CLCNT to 1 is within a period in which the value of a pulse of the PLL 922 is 1 Initially, a test mode terminal TMD is fixed to 1. When delay testing is performed, the clock control terminal CLCNT is initially set to be 0 at the start of the test. In this case, output terminals Q of flip-flops 925 to 928 of FIG. 23 all become 0 (all output terminals NQ become 1), so that the output of an AND gate 936 is fixed to 0.

When a scan-in operation (shift operation) is performed, the scan enable terminal SCEN and the clock switch terminal CLS are set to be 1. By this operation, the selector 14 selects a signal of the test clock terminal TCL. A clock signal is directly supplied from a tester to the test clock terminal TCL. Since the scan flip-flops 51 to 54 select the value of respective terminals SI, the scan flip-flops 51 to 54 perform the shift operation in synchronization with the clock signal input from the test clock terminal TCL.

After the end of the shift operation, when the scan flip-flops 51 to 54 are switched to the capture operation, the scan enable terminal SCEN is switched to 0. The timing of switching the scan enable terminal SCEN from 1 to 0 needs to be within the "scan enable fall request timing range TF" of FIGS. 26A and 26B. Also, the clock switch terminal CLS is switched to 0. By this operation, the selector 14 selects a signal output from the clock generating section 912. Since the scan flip-flops 51 to 54 select the value of respective terminals D, the scan flip-flops 51 to 54 perform a normal operation. At the same time as those of these operations, the clock control terminal CLCNT is switched to 1.

The flip-flops 925 to 928 shift 1 to the right in synchronization with a falling edge of a clock signal of the PLL 922. Therefore, a clock signal of the PLL 922 is started to be output from the AND gate 936 immediately after a second clock pulse falls after the clock control terminal CLCNT is switched to 1. Immediately after a fourth clock pulse falls, the output of the AND gate 936 is fixed to 0 again.

Since the phase of the pulse output from the PLL 922 is not predictable, if the timing of switching the value of the clock switch terminal CLS happens to be within a period in which a pulse of the PLL 922 is 0, the timing of a pulse output from the AND gate 936 of the clock generating section 912 is as illustrated in FIG. 26A. On the other hand, if the timing of switching the value of the clock switch terminal CLS happens to be within a period in which a pulse of the PLL 922 is 1, the timing of a pulse output from the AND gate 936 of the clock generating section 912 is as illustrated in FIG. 26B. In the case of FIG. 26B, the pulse is output earlier by one pulse of the PLL 922 than in the case of FIG. 26A.

When test results captured by the scan flip-flops 51 to 54 are output to the outside by a scan-out operation (shift operation), the scan enable terminal SCEN is switched to 1 as in the scan-in operation. The timing of switching the scan enable terminal SCEN from 0 to 1 needs to be within the "scan enable rise request timing range TR" of FIGS. 26A and 26B. Also, the clock switch terminal CLS is set to be 1. By this operation, the selector 14 selects a clock signal of the test clock terminal TCL. Using this clock signal, values captured by the scan flip-flops 51 to 54 are successively output from a scan-out terminal SCO.

Here, when the shift operation is switched to the capture operation, timing is similar to that of FIGS. 24 and 25, and it is possible to satisfy the timing constraint for switching of the scan enable terminal SCEN from 1 to 0 (the "scan enable fall request timing range TF" of FIGS. 26A and 26B). However, when the capture operation is switched to the shift operation, the "scan enable rise request timing range TR" is completely non-overlapping between FIG. 26A and FIG. 26B. As can be seen from this, there is no timing range which can simultaneously satisfy both the cases of FIGS. 26A and 26B, so that it is in principle not possible to satisfy the timing constraint for switching of the scan enable terminal SCEN from 0 to 1.

Therefore, in semiconductor integrated circuits having a gated clock circuit as illustrated in FIG. 4, it is not possible in the conventional art to perform a scan test in which an externally supplied clock signal is used for a test during the shift operation, and a clock output by a clock generating circuit on a semiconductor integrated circuit is used during the capture operation.

SUMMARY OF THE INVENTION

An object of the present invention is to provide a semiconductor integrated circuit which can be tested using a clock signal having a high frequency without a high-performance tester, by utilizing an oscillator circuit provided inside the semiconductor integrated circuit, even when the semiconductor integrated circuit has a clock stop control circuit for controlling output of a clock signal, and a designing method and a testing method thereof.

Specifically, the present invention provides a semiconductor integrated circuit comprising a combinational circuit section having a combinational circuit, a scan path circuit for inputting and outputting a value from and to the combinational circuit section in accordance with a scan enable signal and in synchronization with a clock signal, and a clock control section for generating and outputting a predetermined number of pulses as the clock signal after a predetermined period has passed since a time when an output command signal was received. The clock control section has an oscillator circuit for generating and outputting the pulse, and is configured to output a last pulse of the predetermined number of pulses in a manner which holds a logical value immediately after an active for the scan path circuit.

Thereby, a last pulse of a clock signal used when a scan path circuit performs a capture operation is caused not to fall and is held in a state in which a value there of is fixed, so that a clock pulse can be caused to fall after a scan enable signal reaches each circuit section. Therefore, even when a semiconductor integrated circuit has a clock stop control circuit for controlling a clock signal, the clock stop control circuit can reliably output a clock signal which is used by a scan path circuit to perform a shift-out operation. Therefore, when a capture operation is performed, a clock signal having an actual operating speed generated in a semiconductor integrated circuit can be used, so that delay testing or the like can be performed without using a high-speed tester.

Preferably, the semiconductor integrated circuit further comprises a clock stop control circuit for outputting the clock signal output from the clock control section to the scan path circuit in accordance with the scan enable signal. The clock control section causes timing of an inactive edge of the last pulse to be later than a change in the scan enable signal.

Preferably, the clock stop control circuit has a flip-flop for latching and outputting a value corresponding to the scan enable signal in synchronization with an edge of a pulse of the clock signal, the edge being opposite to an edge which the scan path circuit synchronizes with, and outputs the clock signal output from the clock control section to the scan path circuit in accordance with the output of the flip-flop.

Preferably, the clock control section has a selection section for selecting and outputting one of a test clock signal input from the outside of the semiconductor integrated circuit and the clock signal output from the clock control section.

Preferably, the selection section performs selection in accordance with a select signal, and the select signal is generated using at least the scan enable signal.

Preferably, in the semiconductor integrated circuit, the clock control section has a period control circuit for controlling a length of a period after a time when the output command signal is received and until start of output of the clock signal.

Preferably, the period control circuit has a counter for counting the number of pulses of an input signal, and when a count value of the counter reaches a predetermined value, outputs a signal indicating that the counter value has reached the predetermined value.

Preferably, the period control circuit further has a shift register for holding and outputting a set value, and uses the value of the shift register as the predetermined value.

Preferably, in the semiconductor integrated circuit, the clock control section uses the scan enable signal as the output command signal.

Preferably, the semiconductor integrated circuit further comprises a clock stop control circuit for outputting the clock signal output from the clock control section to the scan path circuit in accordance with the scan enable signal, and a delay circuit for delaying and outputting the scan enable signal so that the scan enable signal reaches the clock control section later than the scan enable signal reaches the clock stop control circuit.

Preferably, the delay circuit has a combinational circuit element, and the number of the combinational circuit elements is larger than the number of combinational circuits provided on a signal path until the scan enable signal reaches the clock stop control circuit.

Preferably, in the semiconductor integrated circuit, the output command signal is input from the outside of the semiconductor integrated circuit.

Preferably, in the semiconductor integrated circuit, the clock control section comprises a flip-flop which is operated in synchronization with a test clock signal input from the outside of the semiconductor integrated circuit, and uses the test clock signal as the output command signal.

The present invention also provides a semiconductor integrated circuit designing method comprising the steps of designing a semiconductor integrated circuit having a combinational circuit section having a combinational circuit, an oscillator circuit for generating and outputting a clock signal, and a clock stop control circuit for outputting the clock signal in synchronization with a scan enable signal, and inserting a delay circuit for delaying and outputting the scan enable signal so that the scan enable signal reaches later than the scan enable signal reaches the clock stop control circuit.

Preferably, in the semiconductor integrated circuit designing method, the delay circuit has a combinational circuit element, and the number of the combinational circuit elements is larger than the number of combinational circuits provided on a signal path until the scan enable signal reaches the clock stop control circuit.

Preferably, the semiconductor integrated circuit designing method further comprises inserting a scan path circuit for inputting and outputting a value from and to the combinational circuit section in synchronization with the clock signal, and inserting, instead of the oscillator circuit, a clock generating section for generating and outputting a predetermined number of pulses as the clock signal after a predetermined period has passed since a time when an output command signal was received.

Preferably, the semiconductor integrated circuit designing further comprises inserting a selection section for selecting and outputting one of a test clock signal input from the outside of the semiconductor integrated circuit and the clock signal output from the clock generating section.

The present invention also provides a scan test method for a semiconductor integrated circuit comprising a combinational circuit section having a combinational circuit, a scan path circuit for inputting and outputting a value from and to the combinational circuit section in accordance with a scan enable signal and in synchronization with a clock signal, a clock control section having an oscillator circuit for generating and outputting a pulse and for generating and outputting a predetermined number of pulses as the clock signal after a predetermined period has passed since a time when an output command signal was received, and a clock stop control circuit for outputting the clock signal output from the clock control section to the scan path circuit in accordance with the scan enable signal, the method comprising a scan-in step of inputting test data to the scan path circuit in synchronization with a test clock signal input from the outside of the semiconductor integrated circuit, a capture step of causing the scan path circuit to capture an output of the combinational circuit section in synchronization with the clock signal generated in the clock control section, and a scan-out step of outputting a test result captured by the scan path circuit in synchronization with the test clock signal.

Thereby, a clock signal having an actual operating speed generated in a semiconductor integrated circuit can be used, thereby making it possible to perform delay testing or the like without using a high-speed tester.

Preferably, the semiconductor integrated circuit testing method further comprises fixing a value of the test clock signal to 1 after the capture step, and returning the value of the test clock signal to 0 after the fixing step and before inputting the test clock signal to the scan path circuit so as to output the test result.

Preferably, the semiconductor integrated circuit testing method further comprises fixing a value of a last pulse of the test clock signal input in the scan-in step after the value becomes 1, without a modification, and returning the value of the test clock signal to 0 after the fixing step and before inputting the test clock signal to the scan path circuit so as to output the test result.

Preferably, in the semiconductor integrated circuit testing method, delay testing is performed.

According to the present invention, even when a semiconductor integrated circuit has a clock stop control circuit for controlling a clock signal, a clock signal having an actual operating speed required for delay testing, which is generated in the semiconductor integrated circuit, can be used, thereby making it possible to perform a test, such as delay testing, BIST, or the like, without using a high-speed tester.

BRIEF DESCRIPTION OF THE DRAWINGS

FIG. 6A is a timing diagrams illustrating waveforms during a test of the semiconductor integrated circuit of FIG. 1, indicating the case where the timing of switching the value of a clock control terminal CLCNT to 1 is within a period in which the value of a pulse of a PLL 22 is 0. FIG. 6B is a timing diagrams illustrating waveforms during a test of the semiconductor integrated circuit of FIG. 1, indicating the case where the timing of switching the value of the clock control terminal CLCNT to 1 is within a period in which the value of a pulse of the PLL 22 is 1.

FIG. 13A is a timing diagram illustrating waveforms when the semiconductor integrated circuit of FIG. 10 is tested, indicating the case where the timing of inputting a clock pulse to a test clock terminal TCL is within a period in which a pulse of a PLL has value 0. FIG. 13B is a timing diagram illustrating waveforms when the semiconductor integrated circuit of FIG. 10 is tested, indicating the case where the timing of inputting a clock pulse to the test clock terminal TCL is within a period in which a pulse of the PLL has value 1.

FIG. 25 is a timing diagram illustrating waveforms when the conventional semiconductor integrated circuit is tested, indicating the case where the requirement for the signal change timing of the scan enable terminal SCEN is not satisfied.

FIG. 26A is a timing diagram illustrating waveforms during a test of the conventional semiconductor integrated circuit, indicating the case where the timing of switching the value of a clock control terminal CLCNT to 1 is within a period in which the value of a pulse of a PLL is 0. FIG. 26B is a timing diagram illustrating waveforms during a test of the conventional semiconductor integrated circuit, indicating the case where the timing of changing the value of the clock control terminal CLCNT to 1 is within a period in which the value of a pulse of the PLL is 1.

DETAILED DESCRIPTION OF THE PREFERRED EMBODIMENTS

Hereinafter, embodiments of the present invention will be described with reference to the accompanying drawings.

First Embodiment

Figure 1:
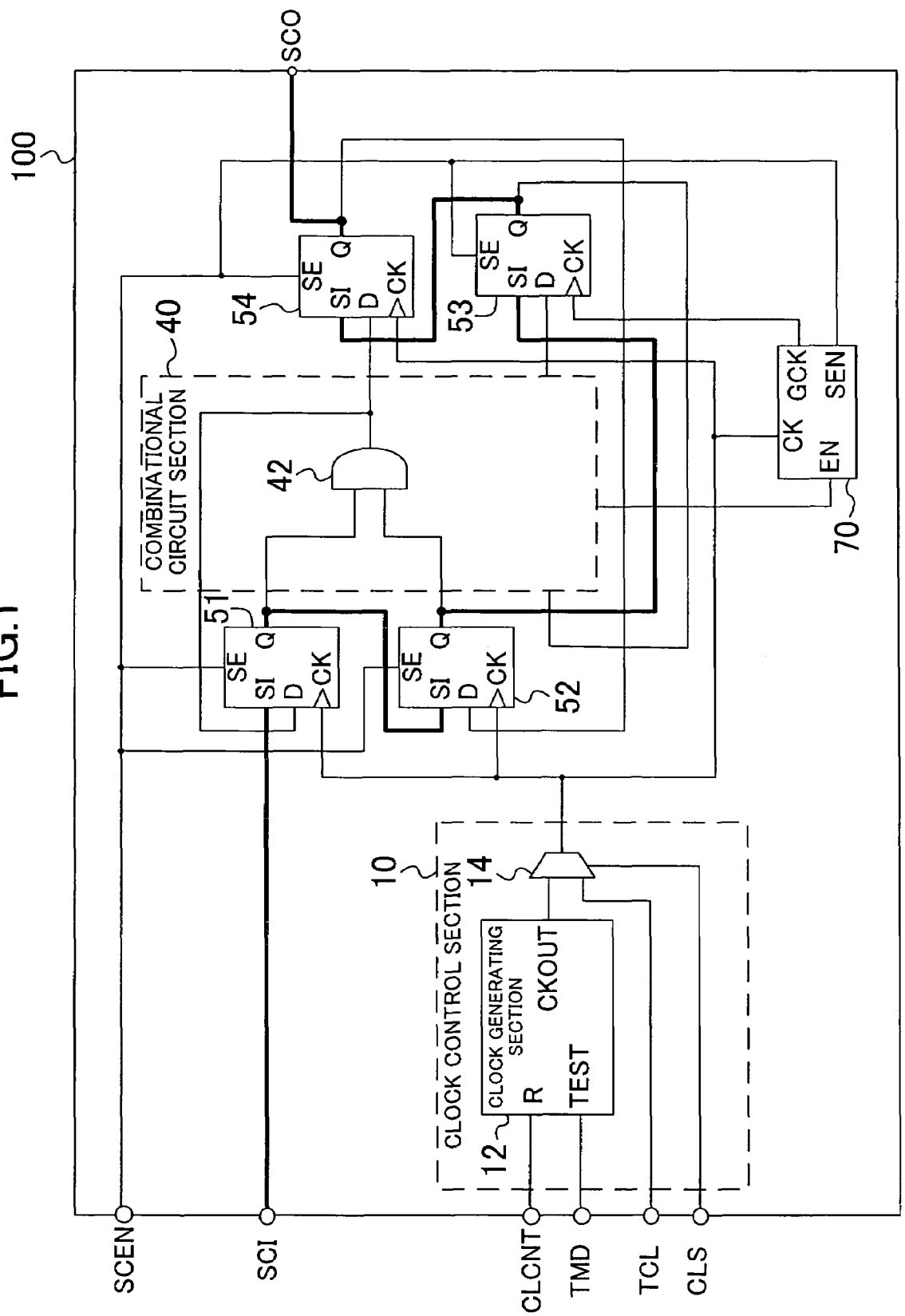
FIG. 1 is a block diagram illustrating a semiconductor integrated circuit according to a first embodiment of the present invention.

FIG. 1 is a block diagram illustrating a semiconductor integrated circuit according to a first embodiment of the present invention. The semiconductor integrated circuit 100 of FIG. 1 comprises a clock control section 10, a combinational circuit section 40, scan flip-flops 51, 52, 53 and 54, and a gated clock circuit 70 as a clock stop control circuit. The clock control section 10 comprises a clock generating section 12, and a selector 14 as a selection section. The combinational circuit section 40 comprises an AND gate 42. The scan flip-flops 51 to 54 constitute a scan path circuit.

The gated clock circuit 70 controls supply of a clock to the scan flip-flop 53. A scan-in terminal SCI, the scan flip-flop 51, the scan flip-flop 52, the scan flip-flop 53, the scan flip-flop 54, and the scan-out terminal SCO are connected together so as to transfer data in this order, constituting a scan chain. The combinational circuit section 40 is operated, depending on changes in output signals of the scan flip-flops 51 to 54, and outputs a generated signal to the gated clock circuit 70 and the like.

Hereinafter, it is assumed that a signal has a logical value (also simply referred to as a value) of 1 when a level of the signal is at a high potential, and a logical value 0 when the level is at a low potential, though the reverse is possible. In an example below, regarding a pulse of a clock signal output from the clock control section 10, an edge at which a value of a signal is changed from 0 to 1 is an active edge for the scan path circuit.

Figure 2:
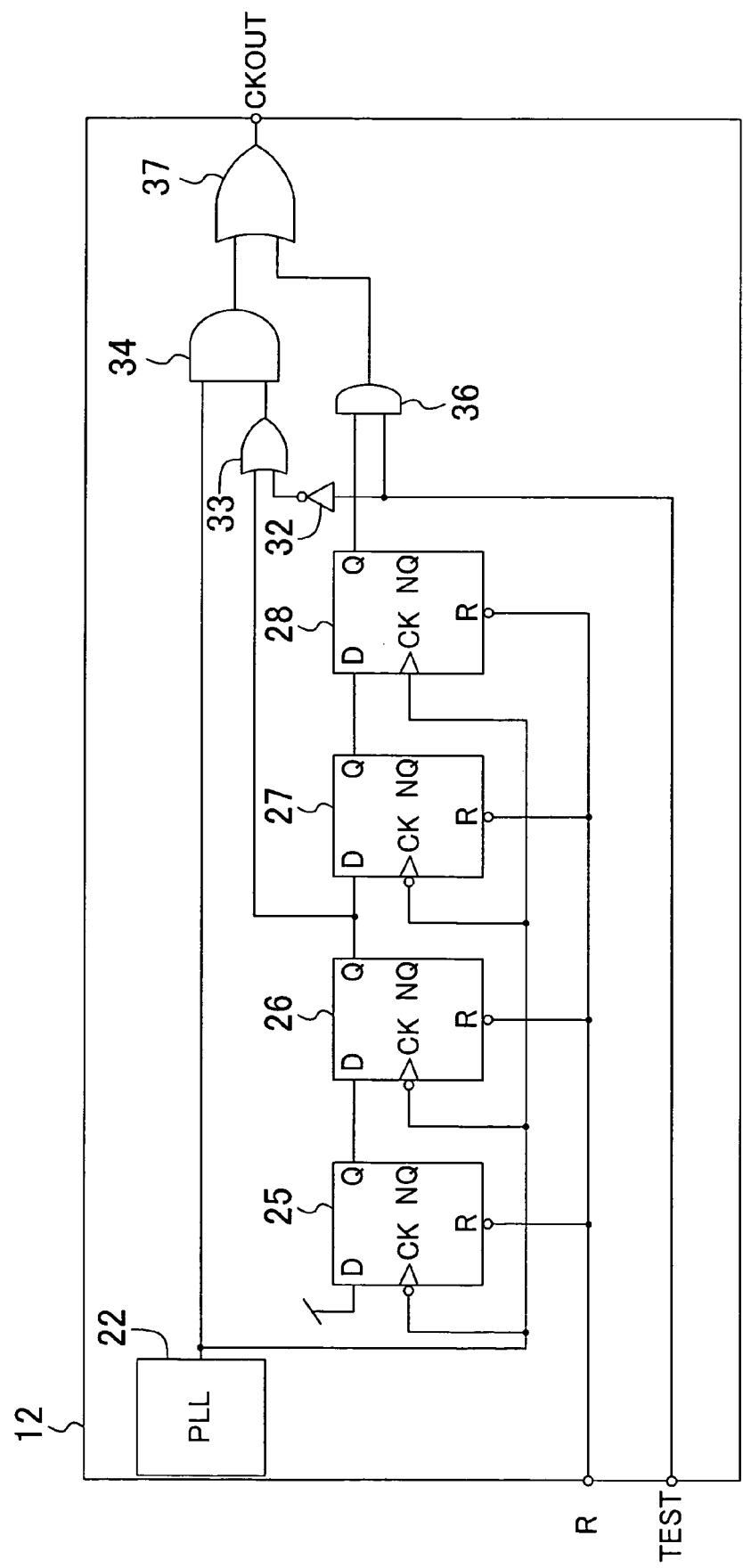
FIG. 2 is a block diagram illustrating an exemplary configuration of a clock generating section of FIG. 1.

FIG. 2 is a block diagram illustrating an exemplary configuration of the clock generating section 12 of FIG. 1. The clock generating section 12 comprises a Phase Locked Loop (PLL) 22 as an oscillator circuit, flip-flops 25, 26, 27 and 28, an inverter 32, OR gates 33 and 37, and AND gates 34 and 36. The PLL 22 generates and outputs a clock signal to the flip-flops 25 to 28 and the AND gate 34.

The flip-flops 25 to 27 each capture a value of a data terminal D and output the value from an output terminal Q in synchronization with a falling edge of the clock signal input to a clock terminal CK. On the other hand, the flip-flop 28 captures a value of a data terminal D and outputs the value from an output terminal Q in synchronization with a rising edge of the clock signal input to a clock terminal CK. The flip-flops 25 to 28 are reset when 0 is input to reset terminals R, and asynchronously output value 0 from the output terminals Q. The data terminal D of the flip-flop 25 is connected to a power supply, and therefore, is always fixed to value 1.

Figure 3:
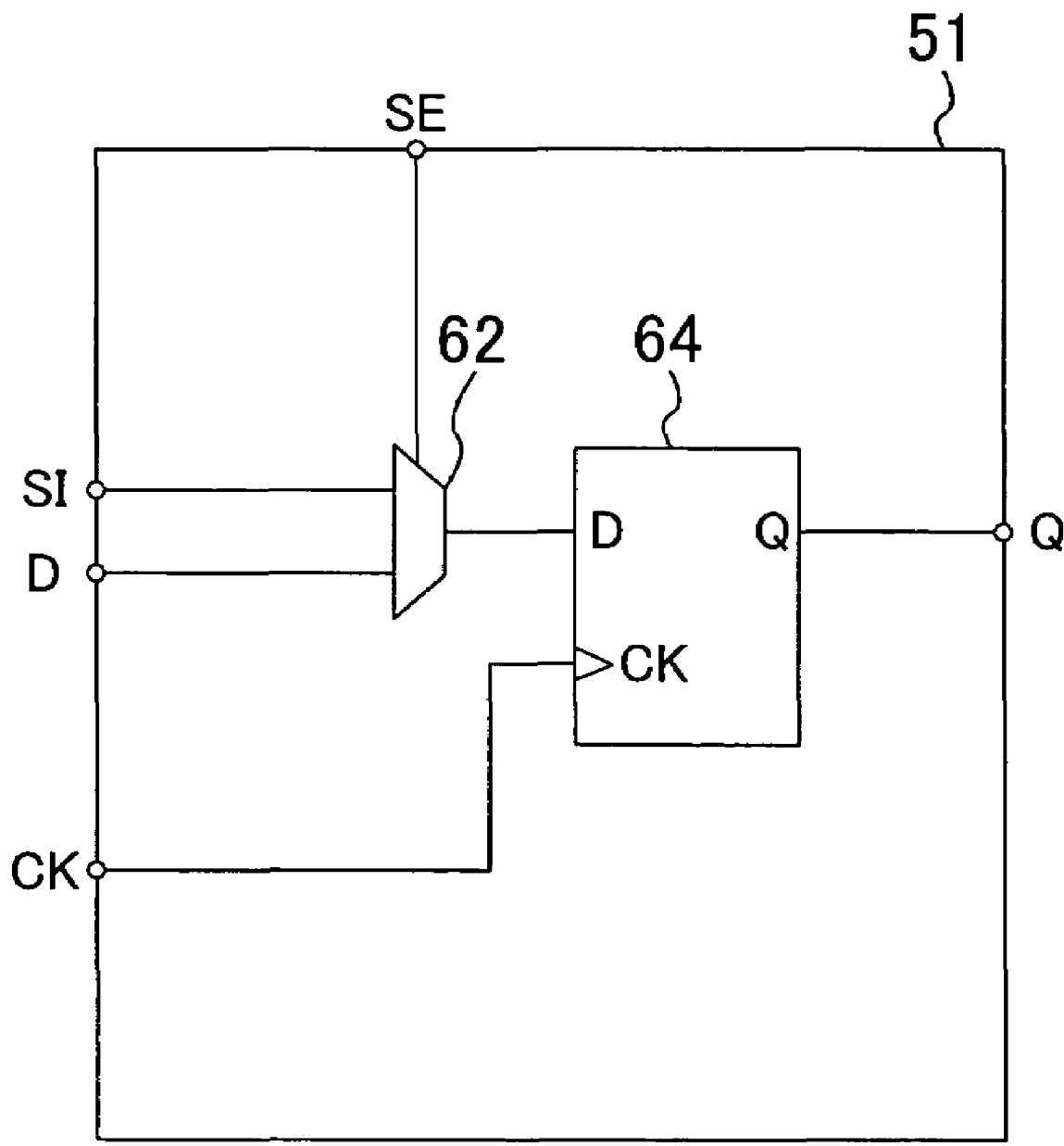
FIG. 3 is a block diagram illustrating an exemplary configuration of a scan flip-flop of FIG. 1.

FIG. 3 is a block diagram illustrating an exemplary configuration of the scan flip-flop 51 of FIG. 1. The scan flip-flops 52 to 54 have a configuration similar to that of the scan flip-flop 51. The scan flip-flop 51 comprises a selector 62 and a flip-flop 64.

The selector 62 selects a signal of the terminal D when a signal input to a terminal SE is 0 (normal operating mode), and a signal of a terminal SI when a signal input to the terminal SE is 1 (scan shift operating mode), and outputs the selected signal to the flip-flop 64. The flip-flop 64 captures data supplied from the selector 62 and outputs the data from a terminal Q in synchronization with a clock signal input to a clock terminal CK.

Figure 4:
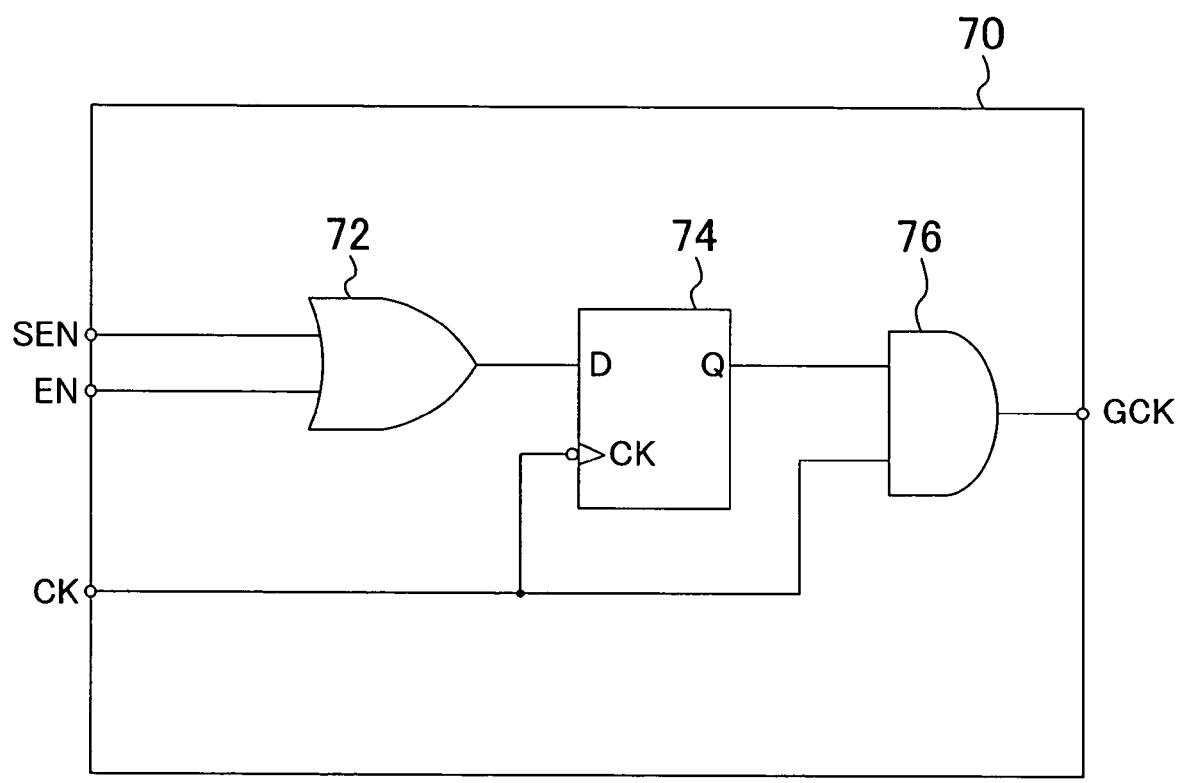
FIG. 4 is a block diagram illustrating an exemplary configuration of a gated clock circuit of FIG. 1.

FIG. 4 is a block diagram illustrating an exemplary configuration of the gated clock circuit 70 of FIG. 1. The gated clock circuit 70 comprises an OR gate 72, a flip-flop 74, and an AND gate 76.

A scan enable signal is input via a scan enable terminal SCEN to a scan enable terminal SEN of the gated clock circuit 70, and a signal for controlling ON/OFF of a clock signal is input to a clock enable input terminal EN of the gated clock circuit 70. The scan enable signal is a signal for switching between a shift operation and a capture operation during a scan test. The OR gate 72 obtains a logical sum of these signals and outputs the logical sum to the flip-flop 74. The flip-flop 74 captures and outputs an output of the OR gate 72 to the AND gate 76 in synchronization with a falling edge of a clock input to a terminal CK of the gated clock circuit 70.

Figure 5:
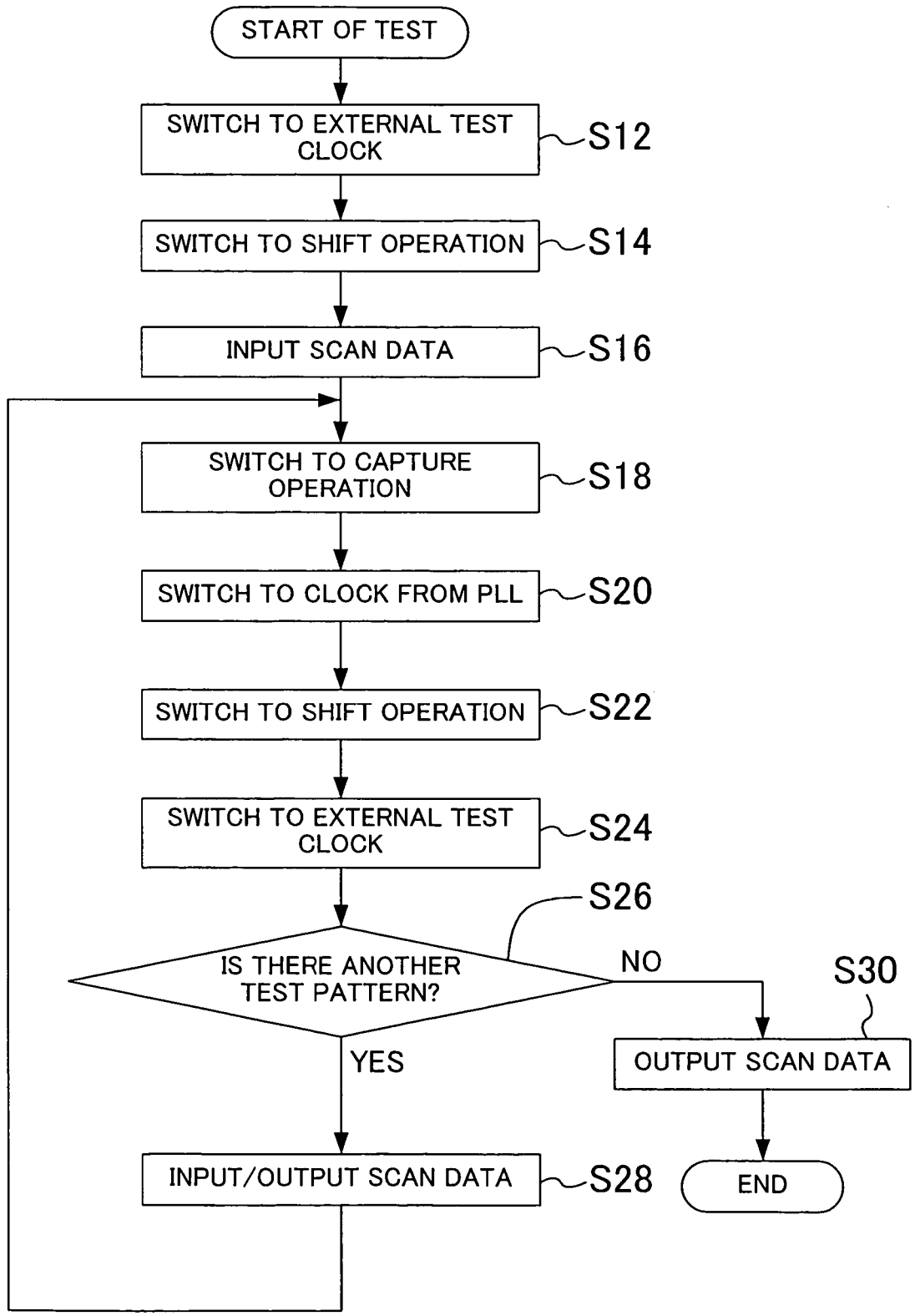
FIG. 5 is a flowchart illustrating a process of a testing method in the semiconductor integrated circuit of FIG. 1.

FIG. 5 is a flowchart illustrating a process of a testing method in the semiconductor integrated circuit 100 of FIG. 1. FIGS. 6A and 6B are timing diagrams illustrating waveforms during a test of the semiconductor integrated circuit 100 of FIG. 1, indicating the case where the timing of switching the value of the clock control terminal CLCNT to 1 is within a period in which the value of a pulse of the PLL 22 is 0, and the case where the timing is within a period in which the value of a pulse of the PLL 22 is 1, respectively.

Hereinafter, a clock control signal input to the clock control terminal CLCNT is used as a capture clock output command signal, unless otherwise specified. Particularly, switching of the value of the clock control signal to 1 corresponds to the output command signal. A test clock signal is directly supplied to the test clock terminal TCL from a tester or the like external to the semiconductor integrated circuit 100. Hereinafter, a clock signal output from the PLL 22 is assumed to have a frequency two times higher than that of the test clock signal.

During a normal operation, the values of the test mode terminal TMD, the clock switch terminal CLS, and the scan enable terminal SCEN in the semiconductor integrated circuit 100 are fixed to 0. In this case, the output of the OR gate 33 of FIG. 2 is fixed to 1, and the output of the AND gate 36 is fixed to 0, so that the OR gate 37 outputs the clock signal output by the PLL 22 without a modification. The selector 14 selects an output of the clock generating section 12, so that the clock signal output by the PLL 22 is supplied to the scan flip-flop 51, 52 and 54 and the gated clock circuit 70 without a modification.

The gated clock circuit 70 supplies a clock signal to the scan flip-flop 53, depending on a signal input to the terminal EN. Each of the scan flip-flops 51 to 54 operates as a typical flip-flop.

An operation of the semiconductor integrated circuit 100 during a test will be described. In this embodiment, as an example, the case where delay testing is performed will be described.

In step S12 of FIG. 5, a process for switching a clock signal supplied to the scan flip-flops 51 to 54 to an externally input test clock signal, is performed. Specifically, the test mode terminal TMD is fixed to value 1, and value 0 is input to the clock control terminal CLCNT. In this case, all the flip-flops 25 to 28 are reset, so that the values of the respective output terminals Q are 0, and the output values of the AND gates 34 and 36 are 0. Therefore, the clock generating section 12 stops outputting a clock signal, so that the value of a terminal CKOUT is fixed to 0. Also, the value of the clock switch terminal CLS is set to be 1. By this operation, the selector 12 selects and outputs the test clock signal input to the test clock terminal TCL.

Note that, here, an inverted signal of a signal input to the clock switch terminal CLS is input to the clock control terminal CLCNT, and the two signals are assumed to have the same timing of change, though the two signals may have different timing.

In step S14, switching is performed so as to perform a shift operation (scan-in operation). Specifically, value 1 is input to the scan enable terminal SCEN. As a result, the scan flip-flops 51 to 54 select and output the values of the respective terminals SI.

In step S16, test data is input to the scan-in terminal SCI. As a result, the scan flip-flops 51 to 54 successively shift the test data in synchronization with the test clock signal input from the test clock terminal TCL (scan-in operation). It is now assumed that four values 0, 0, 1 and are successively input from the scan-in terminal SCI, so that values 1, 1, 0 and 0 are set in the scan flip-flops 51 to 54, respectively.

After the end of the shift operation, in step S18, the value of the scan enable terminal SCEN is set to be 0 so that the scan flip-flops 51 to 54 are switched to a capture operation. Thereby, the scan flip-flops 51 to 54 select and output the values of the respective terminals D. Here, the value of the scan enable terminal SCEN is changed during a period when a last clock pulse of the shift operation is 1.

In step S20, switching to a clock signal from the PLL 22 is performed so as to perform a capture operation. Specifically, the value of the clock switch terminal CLS is set to be 0. By this operation, the selector 14 selects a signal output from the clock generating section 12. At the same time, the value of the clock control terminal CLCNT is set to be 1. The flip-flops 25 and 26 are provided so as to control a period after the value of the clock control terminal CLCNT is set to be 1 and until the clock signal of the PLL 22 is started to be output from the terminal CKOUT of the clock generating section 12.

In FIG. 2, the flip-flops 25 to 28 successively shift value 1 to the right. In this case, the flip-flops 25 to 27 perform shift in synchronization with a fall of the clock signal of the PLL 22, and the flip-flop 28 performs shift in synchronization with a rise of the clock signal of the PLL 22. Therefore, in the case of the circuit of FIG. 2, a clock signal is started to be output from the terminal CKOUT of the clock generating section 12 immediately after a second clock pulse of the PLL 22 falls after the value of the clock control terminal CLCNT is set to be 1. When a fourth clock pulse rises, the value of the terminal CKOUT of the clock generating section 12 is fixed to 1.

In other words, only two pulses of clock signal of the PLL 22 are output from the terminal CKOUT of the clock generating section 12. Of the two pulses, the first pulse is a pulse of signal output from the PLL 22 without a modification, and the second pulse is the same as a pulse of signal output from the PLL 22 until the rise, and is then fixed to value 1 i.e., the pulse of the signal output from the PLL 22 is deformed) (see FIGS. 6A and 6B).

In this case, the values of the scan flip-flops 51 to 54 due to the first pulse are 1, 0, X, and 1, respectively (X is a value varying depending on the configuration of the combinational circuit section 40), and a transition of 1→0 is propagated on a path of the scan flip-flop 52→the AND gate 42→the scan flip-flop 54. Further, due to the second pulse, the transition on the path is captured into the scan flip-flop 54. If the path is normal, the value 0 after the transition is captured. If a delay fault is present on the path, the value 1 before the transition is captured.

Since the phase of the pulse output from the PLL 22 is not predictable, if the timing of switching the value of the clock control terminal CLCNT to 1 is within a period in which the value of a pulse of the PLL 22 is 0, the timing of a pulse output from the terminal CKOUT of the clock generating section 12 is as illustrated in FIG. 6A. On the other hand, if the timing of switching the value of the clock control terminal CLCNT to 1 is within a period in which the value of a pulse of the PLL 22 is 1, the timing of a pulse output from the terminal CKOUT of the clock generating section 12 is as illustrated in FIG. 6B, and is earlier by one pulse of the PLL 22 than in the case of FIG. 6A. In either case, the clock generating section 12 correctly supplies two pulses without a hazard.

In step S22, switching is performed so as to perform a shift operation (scan-out operation). Specifically, value 1 is input to the scan enable terminal SCEN. As a result, the scan flip-flops 51 to 54 select and output the values of the respective terminals SI.

In step S24, a clock signal supplied to the scan flip-flops 51 to 54 is switched to an externally input test clock signal, and a scan-out operation is performed. Specifically, initially, in step S22, after a predetermined time (time difference d in FIGS. 6A and 6B) has passed since the value of the scan enable terminal SCEN was changed, value 0 is input to the clock control terminal CLCNT, and value 1 is input to the clock switch terminal CLS. In this case, all the flip-flops 25 to 28 are reset, so that the value of the output of the clock generating section 12 is changed and fixed to 0. The selector 14 selects a test clock signal input to the test clock terminal TCL.

Since the time difference d is provided between the timing of changing the value of the scan enable terminal SCEN and the timing of a fall of a clock signal output from the clock generating section 12, the flip-flop 74 of the gated clock circuit 70 can capture value 1 after a change at the scan enable terminal SCEN. Therefore, the output of the flip-flop 74 is changed to 1, so that a shift clock can be supplied to the flip-flop 53.

Next, in step S26, it is determined whether or not another test pattern to be applied remains. If another test pattern remains, the process goes to step S28. If no test pattern remains, the process goes to step S30.

In step S28, the test results captured in the scan flip-flops 51 to 54 are output from the scan-out terminal SCO, and at the same time, the next test data are successively captured from the scan-in terminal SCI (scan-in operation), in synchronization with a test clock signal input from the test clock terminal TCL. Thereafter, the process goes to step S18.

In step S30, the test results captured in the scan flip-flops 51 to 54 are output from the scan-out terminal SCO in synchronization with a test clock signal input from the test clock terminal TCL. Further, a tester is used to compare the test result with an expected value to check whether or not there is a failure in the combinational circuit section 40, and the process is ended.

In the semiconductor integrated circuit of FIG. 1, when the capture operation is switched to the shift operation, the predetermined time difference d can be provided between the timing of switching the value of the scan enable terminal SCEN and the timing of switching the clock control terminal CLCNT. Therefore, the flip-flop 74 of the gated clock circuit 70 can stably capture value 1 after a change at the scan enable terminal SCEN. As a result, a shift clock can be supplied to the scan flip-flop 53.

Specifically, according to the semiconductor integrated circuit 100 of FIG. 1, even when the gated clock circuit 70 is included, a clock having an actual operating speed required for delay testing, which is generated by a PLL included in the semiconductor integrated circuit itself, can be used to reliably perform a scan test. Therefore, it is not necessary to use a high-speed tester for supplying a high-speed clock signal.

Second Embodiment

Figure 7:
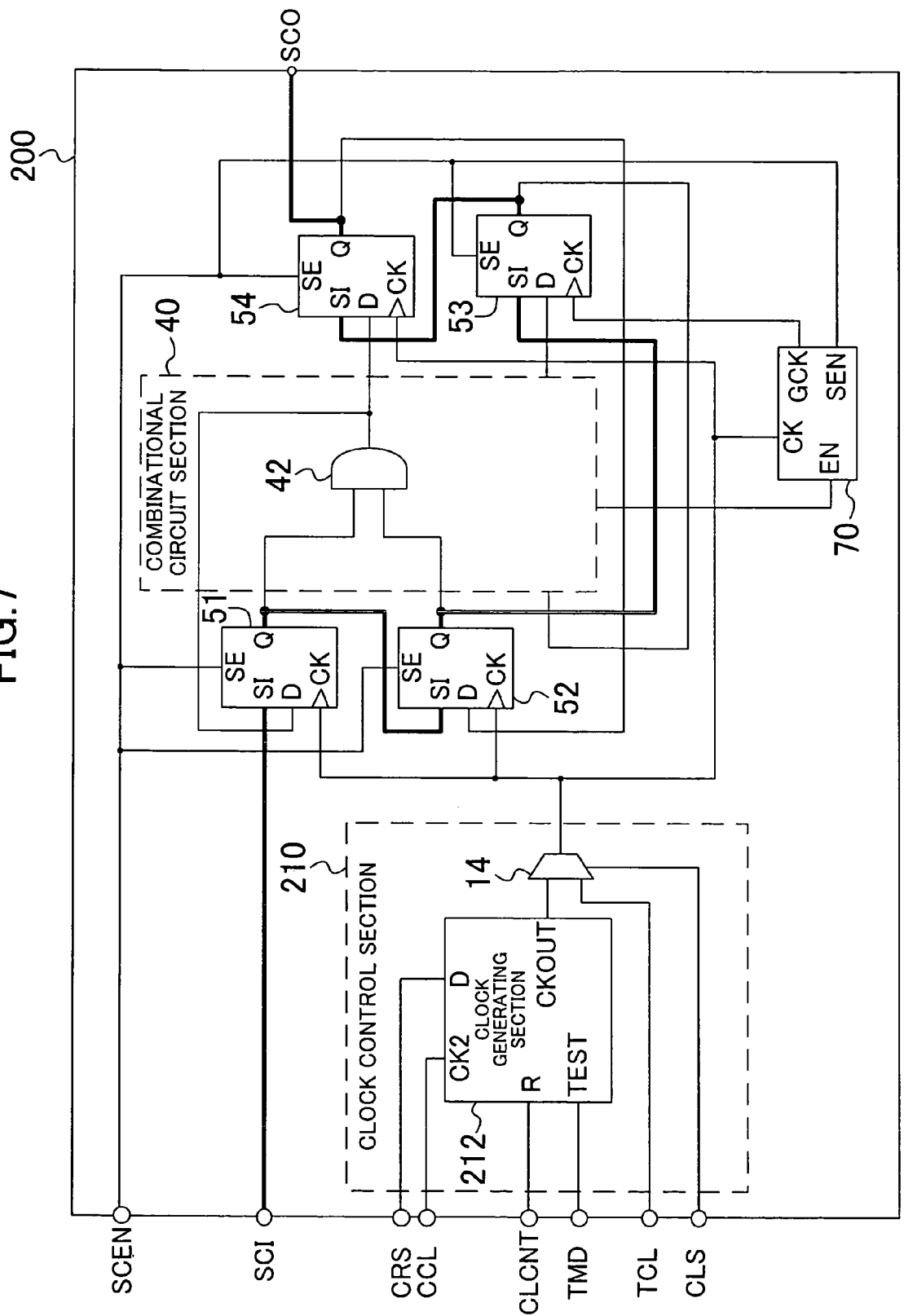
FIG. 7 is a block diagram illustrating a semiconductor integrated circuit according to a second embodiment of the present invention.

FIG. 7 is a block diagram illustrating a semiconductor integrated circuit according to a second embodiment of the present invention. The semiconductor integrated circuit 200 of FIG. 7 is the same as the semiconductor integrated circuit 100 of FIG. 1, except that a clock control section 210 is provided instead of the clock control section 10. The clock control section 210 comprises a clock generating section 212 and a selector 14. Parts other than the clock generating section 212 are similar to those of the first embodiment and are indicated with the same reference numerals, and will not be described.

Figure 8:
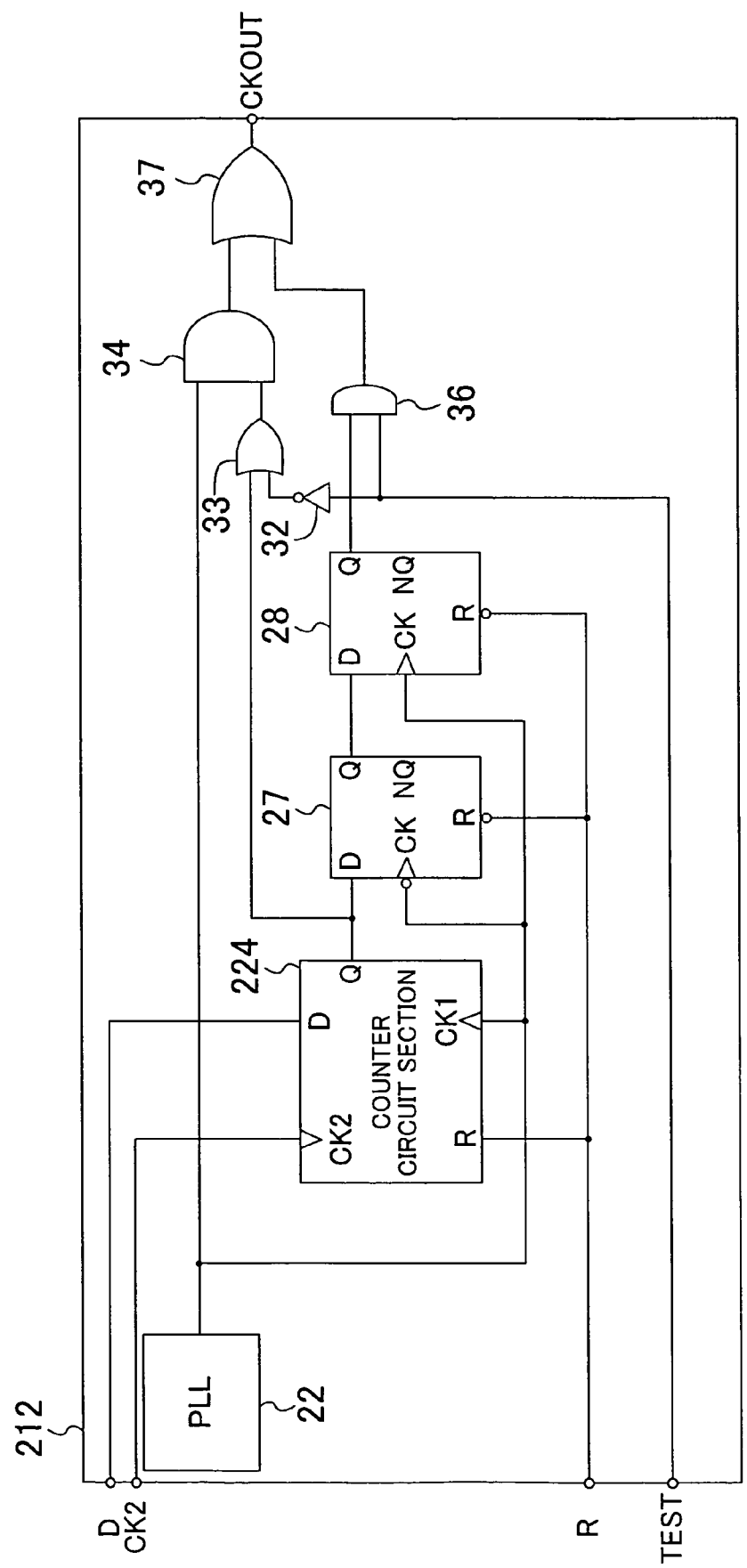
FIG. 8 is a circuit diagram illustrating an exemplary configuration of a clock generating section of FIG. 7.

FIG. 8 is a circuit diagram illustrating an exemplary configuration of the clock generating section 212 of FIG. 7. The clock generating section 212 is the same as the clock generating section 12 of FIG. 2, except that a counter circuit section 224 as a period control circuit is provided instead of the flip-flops 25 and 26.

Figure 9:
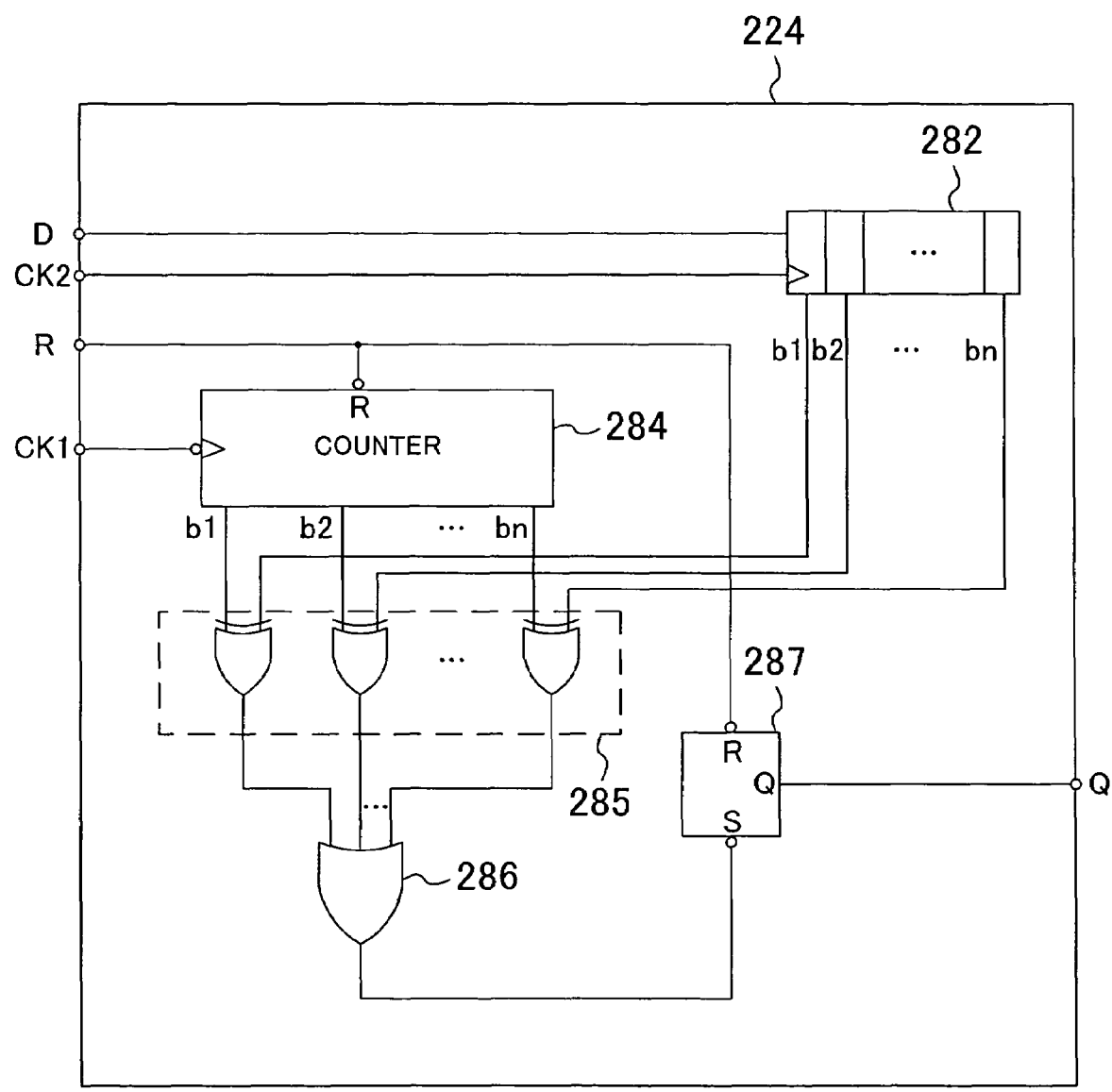
FIG. 9 is a circuit diagram illustrating an exemplary configuration of a counter circuit section of FIG. 8.

FIG. 9 is a circuit diagram illustrating an exemplary configuration of the counter circuit section 224 of FIG. 8. The counter circuit section 224 comprises an n-bit shift register 282, a counter 284 having an n-bit width, a comparator 285 for comparing n-bit signals, an OR gate 286, and an RS latch 287.

Hereinafter, the semiconductor integrated circuit 200 of FIG. 7 will be described with reference to FIGS. 6 to 9. The counter circuit section 224 is a circuit for detecting whether or not the number of input pulses is equal to a set value, where the set value can be freely set within a range of 2 to $2^n$. Specifically, before the start of a test, a desired value can be written into the shift register 282 by inputting a value to a terminal CRS of the semiconductor integrated circuit 200, in synchronization with input of a clock signal to a terminal CCL of the semiconductor integrated circuit 200.

The counter 284 starts counting clock pulses output from the PLL 22 when the value of the clock control terminal CLCNT becomes 1. The counter 284 performs counting in synchronization with a fall of a clock pulse. The comparator 285 compares a count of the counter 284 with an output of the shift register 282 for each bit, and outputs the result to the OR gate 286. When the count of the counter 284 becomes equal to a value written in the shift register 282, all bits of an n-bit output value output by the comparator 285 become 0, so that the output value of the OR gate 286 becomes 0, whereby the output value of the RS latch 287 becomes 1.

Now, when the value written in the shift register 282 is "2", i.e., $(b_1, b_2, \ldots, b_{n-1}, b_n)=(0, 0, \ldots, 1, 0)$, the counter circuit section 224 outputs 1 when a second pulse of the PLL 22 falls. In other words, since the counter circuit section 224 is operated in a manner similar to that of the circuit composed of the flip-flops 25 and 26 of FIG. 2, the clock generating section 212 is operated as illustrated in FIG. 6 in a manner similar to that of the clock generating section 12.

Also, by changing a value to be written into the shift register 282, a period after the value of the clock control terminal CLCNT is changed from 0 to 1 and until a pulse is started to be output from the clock generating section 212, can be freely controlled.

In the clock generating section 12 of FIG. 2, it is necessary to provide a similar flip-flop in addition to the flip-flops 25 and 26 so as to increase the period after the value of the clock control terminal CLCNT is changed from 0 to 1 and until a pulse is started to be output. Therefore, after manufacture of the semiconductor integrated circuit, the period cannot be changed. In contrast to this, in the clock generating section 212 of FIG. 8, the period can be freely changed when a test is performed.

Particularly, when the PLL has a considerably high speed, it is often that a period having a predetermined length or more needs to be secured as a margin after a shift operation is switched to a capture operation and until a clock pulse is input to the scan flip-flops 51 to 54, in terms of enhancement of the stability of tests. In the case of the clock generating section 12, even if a margin is turned out to be insufficient when a test is performed, the margin cannot be changed. In contrast to this, in the clock generating section 212 of this embodiment, a margin can be freely changed when a test is performed.

Note that, in the counter circuit section 224, only the counter 284 and the RS latch 287 may be provided, and one bit of the output of the counter 284 may be input to a terminal S of the RS latch 287. Thereby, although the function of changing a margin when a test is performed is lost, a function similar to that of the flip-flops 25 and 26 in the clock generating section 12 can be achieved by the counter circuit section 224 by, for example, outputting a second bit counted from the least significant bit of the output of the counter 284 to the RS latch 287.

Third Embodiment

Figure 10:
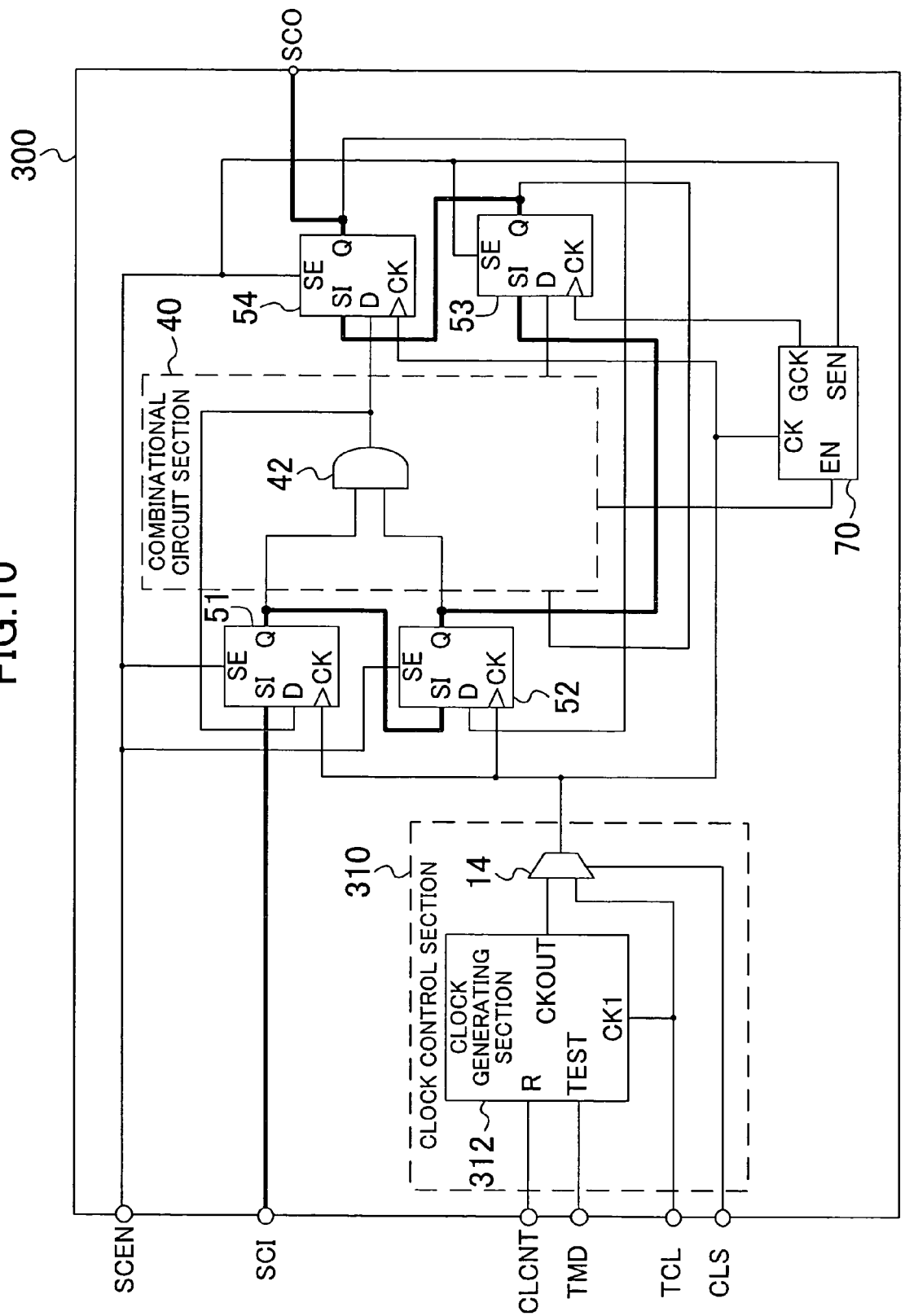
FIG. 10 is a block diagram illustrating a semiconductor integrated circuit according to a third embodiment of the present invention.

FIG. 10 is a block diagram illustrating a semiconductor integrated circuit according to a third embodiment of the present invention. The semiconductor integrated circuit 300 of FIG. 10 is the same as the semiconductor integrated circuit 100 of FIG. 1, except that a clock control section 310 is provided instead of the clock control section 10. The clock control section 310 comprises a clock generating section 312 and a selector 14. A test clock signal input to the test clock terminal TCL is also input to the clock generating section 312. Parts other than the clock generating section 312 are similar to those of the first embodiment and are indicated with the same reference numerals, and will not be described.

Figure 11:
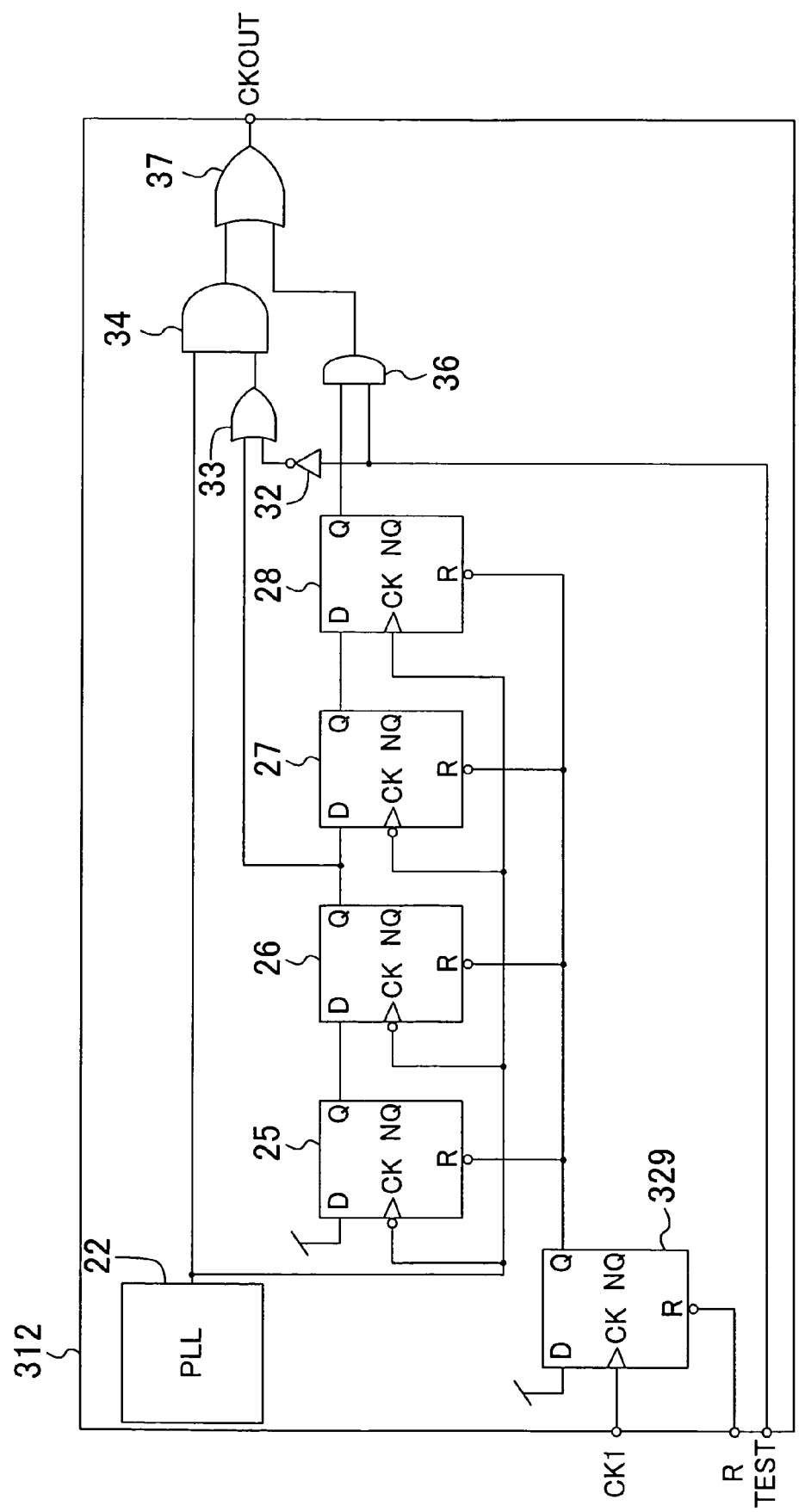
FIG. 11 is a circuit diagram illustrating an exemplary configuration of a clock generating section of FIG. 10.

FIG. 11 is a circuit diagram illustrating an exemplary configuration of the clock generating section 312 of FIG. 10. The clock generating section 312 is the same as the clock generating section 12 of FIG. 2, except that a flip-flop 329 is further provided. An output of the flip-flop 329 is supplied to the reset terminals of the flip-flops 25 to 29.

Figure 12:
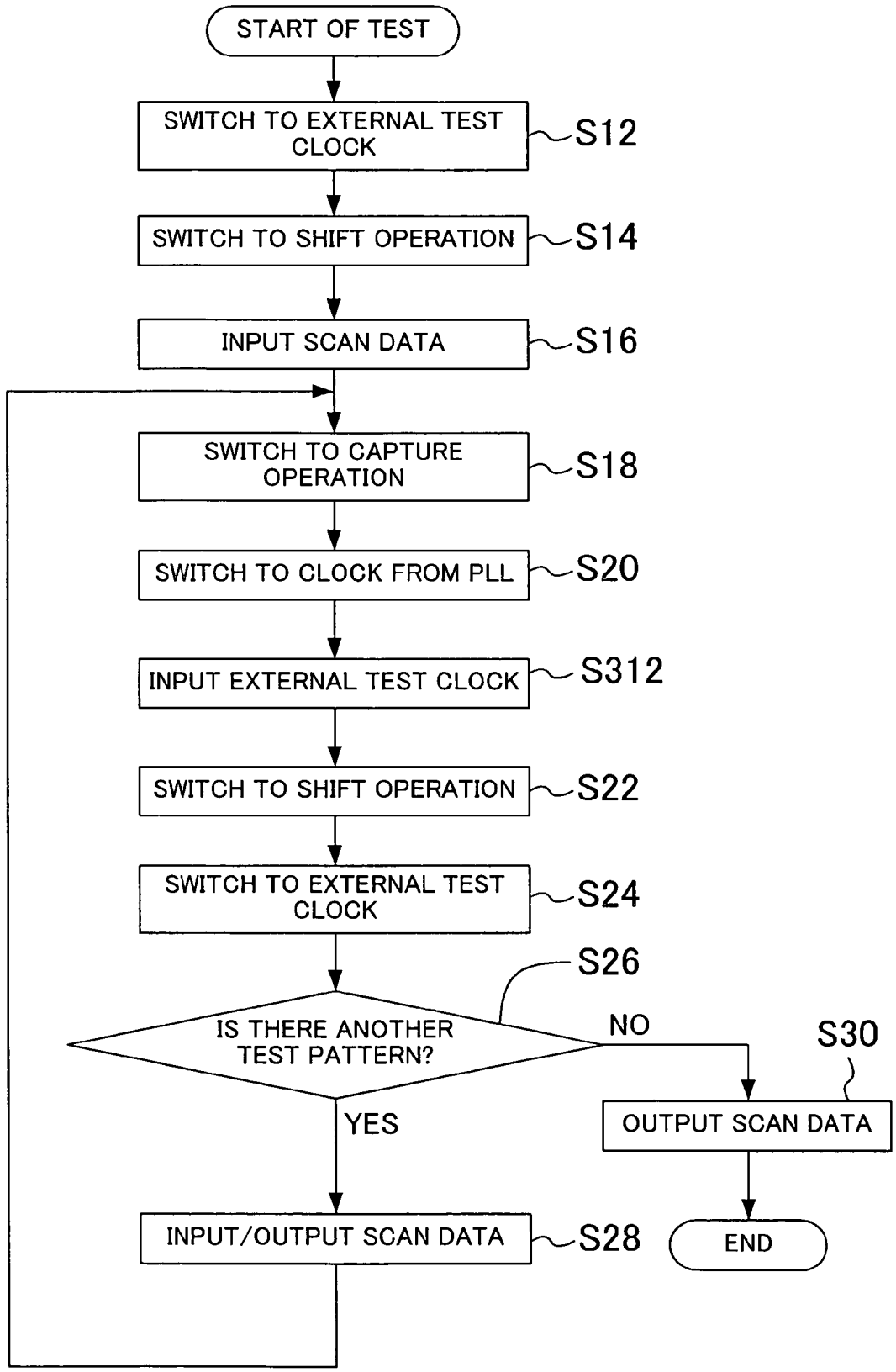
FIG. 12 is a flowchart illustrating a process of a testing method in the semiconductor integrated circuit of FIG. 10.

FIG. 12 is a flowchart illustrating a process of a testing method in the semiconductor integrated circuit 300 of FIG. 10. FIGS. 13A and 13B are timing diagrams illustrating waveforms when the semiconductor integrated circuit 300 of FIG. 10 is tested, indicating the case where the timing of inputting a clock pulse to the test clock terminal TCL is within a period in which a pulse of the PLL 22 has value 0 and the case where the timing of inputting a clock pulse to the test clock terminal TCL is within a period in which a pulse of the PLL 22 has value 1, respectively.

An operation of the semiconductor integrated circuit 300 during a test will be described. In this embodiment, as an example, the case where delay testing is performed will be described. Steps other than step S312 of FIG. 12 are similar to those of FIG. 5 and will not be described. In step S20, at the time when the value of the clock control terminal CLCNT is set to be 1, the output of the flip-flop 329 is 0, so that the flip-flops 25 to 28 have not been operated yet, and all the outputs are still 0.

In step S312, one pulse of test clock signal is input to the test clock terminal TCL from an external tester. Here, the test clock signal is used as a trigger signal with respect to the clock generating section 312. The test clock signal is not selected in the selector 14, so that there is not a direct influence on the scan flip-flops 51 to 54.

By this operation, the value of the terminal Q of the flip-flop 329 is changed to 1, and thereafter, the flip-flops 25 to 27 successively shift value 1 to the left. In this case, the flip-flops 25 to 27 perform shift in synchronization with a fall of a clock signal output by the PLL 22, and the flip-flop 28 performs shift in synchronization with a rise of the clock signal of the PLL 22.

Therefore, in the case of the circuit of FIG. 11, a clock signal is started to be output from the terminal CKOUT of the clock generating section 312 immediately after a second clock pulse of the PLL 22 falls after the value of the clock control terminal CLCNT becomes 1 and a pulse of test clock signal is input. After a fourth clock pulse rises, the value of the terminal CKOUT of the clock generating section 312 is fixed to 1 without a modification.

In other words, only two pulses of the clock signal of the PLL 22 are output from the terminal CKOUT of the clock generating section 312. Of the two pulses, the first pulse is a pulse of a signal output from the PLL 22 without a modification, and the second pulse is the same as the pulse of the signal output from the PLL 22 until the rise, and is then fixed to value 1 without a modification (i.e., the pulse of the signal output from the PLL 22 is deformed) (see FIGS. 13A and 13B).

The values of the scan flip-flops 51 to 54 are changed due to the two pulses in a manner similar to that of the first embodiment. If a path of the scan flip-flop 52→the AND gate 42→the scan flip-flop 54 is normal, value 0 after transition is captured into the scan flip-flop 54. If there is a delay fault on the path, value 1 before transition is captured into the scan flip-flop 54.

Since the phase of the pulse output from the PLL 22 is not predictable, if the timing of inputting a clock pulse to the test clock terminal TCL is within a period in which the value of a pulse of the PLL 22 is 0, the timing of a pulse output from the terminal CKOUT of the clock generating section 312 is as illustrated in FIG. 13A. On the other hand, if the timing of inputting a clock pulse to the test clock terminal TCL is within a period in which the value of a pulse of the PLL 22 is 1, the timing of a pulse output from the terminal CKOUT of the clock generating section 312 is as illustrated in FIG. 13B, and is earlier by one pulse of the PLL 22 than in the case of FIG. 13A. In either case, the clock generating section 312 correctly supplies two pulses without a hazard.

Although it has been described, in the capture operation, the number of clock pulses input to the test clock terminal TCL is one, the number of clock pulses may be two or more. This is because only the first pulse is effective. Therefore, it may be assumed that the selector 14 invariably selects a test clock signal input from the test clock terminal TCL during a test; and on this assumption, a test pattern may be configured so that a test clock signal is supplied to the test clock terminal TCL both during a shift operation and a capture operation (i.e., two pulses of capture clock are input from the test clock terminal TCL during a capture operation); and when an actual test is performed, the selector 14 may select an output of the clock generating section 312 during a capture operation.

Fourth Embodiment

Figure 14:
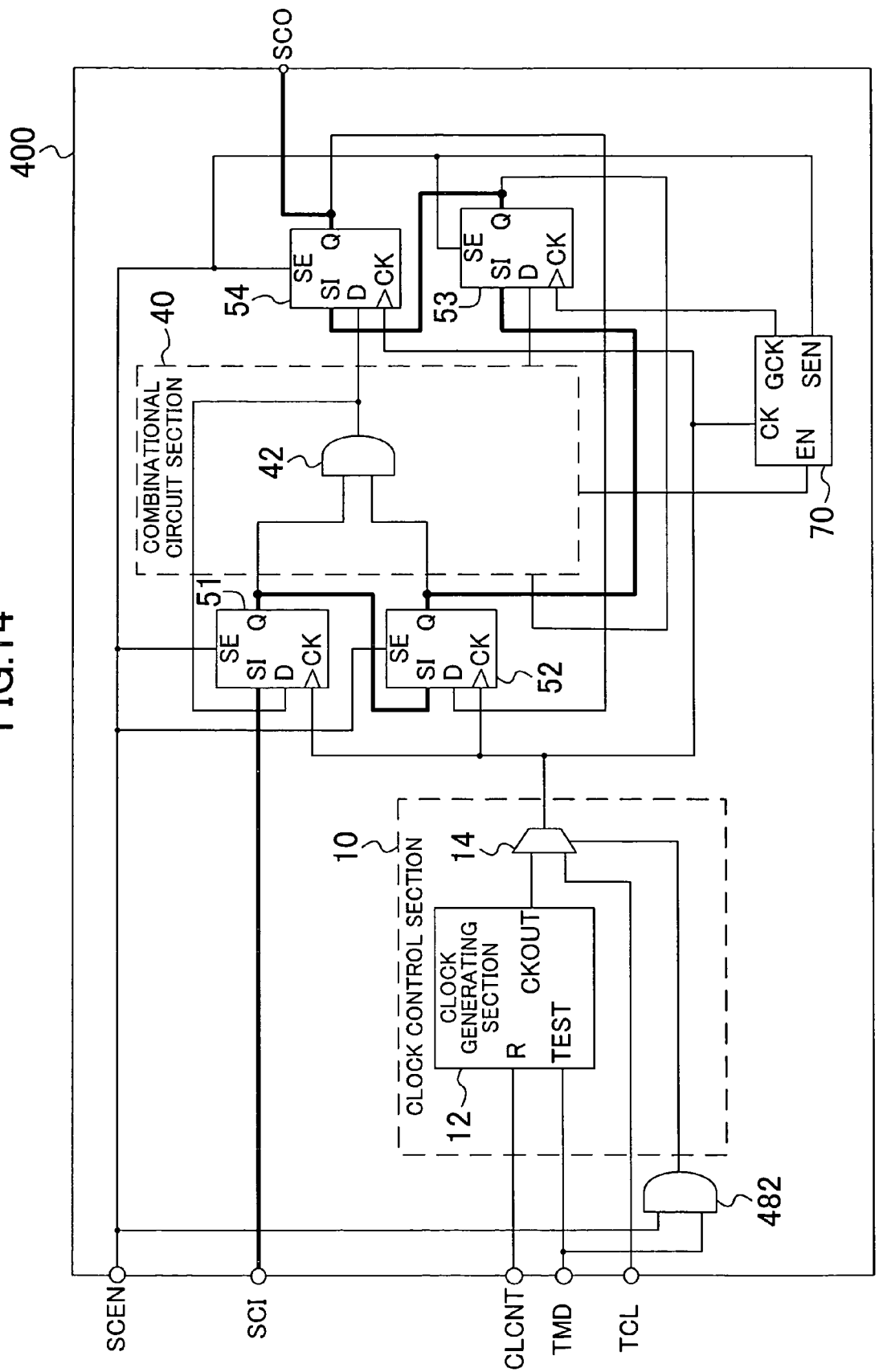
FIG. 14 is a block diagram illustrating a semiconductor integrated circuit according to a fourth embodiment of the present invention.

FIG. 14 is a block diagram illustrating a semiconductor integrated circuit according to a fourth embodiment of the present invention. The semiconductor integrated circuit 400 of FIG. 14 is the same as the semiconductor integrated circuit 100 of FIG. 1, except that an AND gate 482 is further provided. The AND gate 482 receives a scan enable signal input to the scan enable terminal SCEN and a signal input to the test mode terminal TMD. Parts other than the AND gate 482 are similar to those of the first embodiment and are indicated with the same reference numerals, and will not be described.

Figure 15:
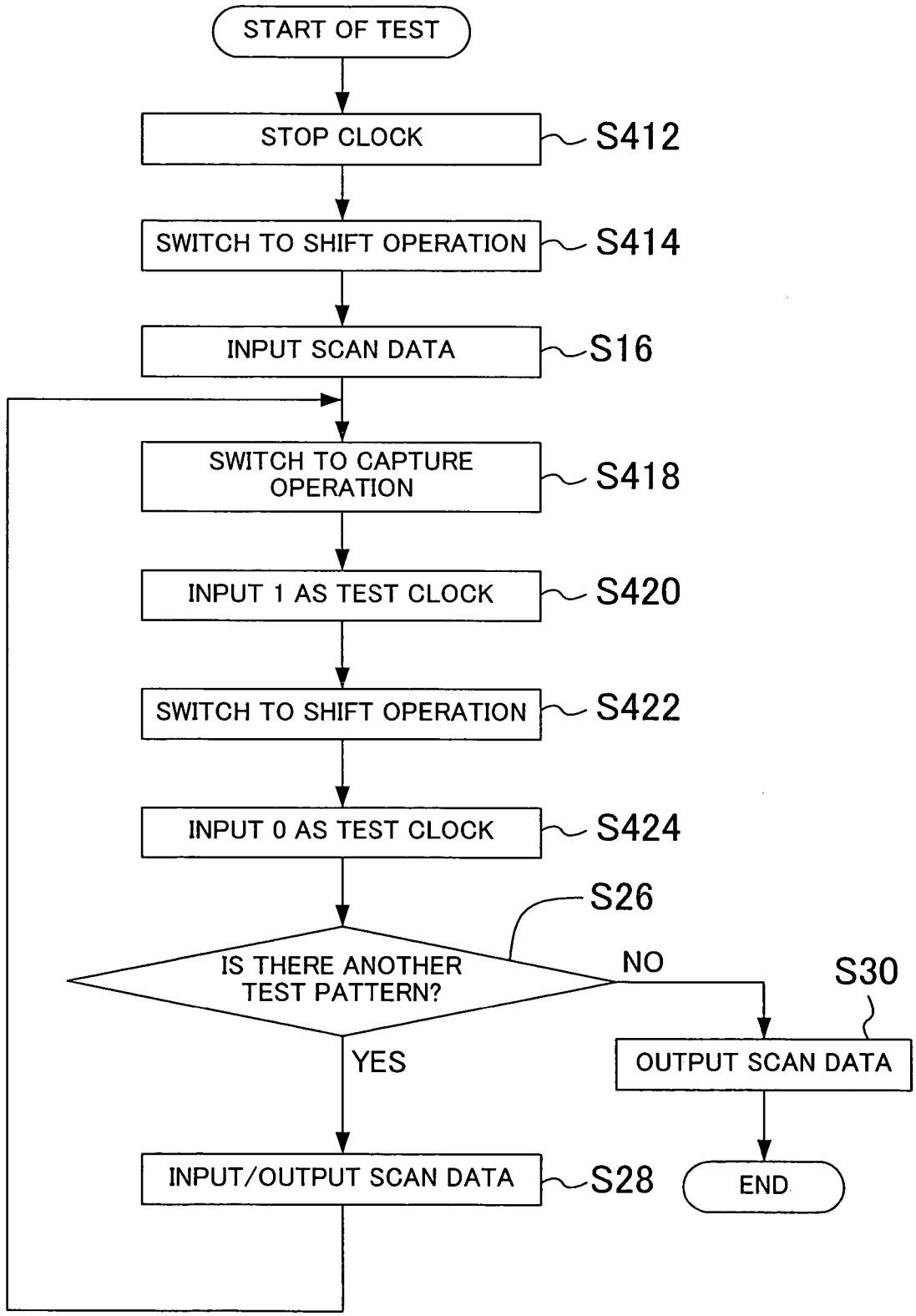
FIG. 15 is a flowchart illustrating a process of a testing method in the semiconductor integrated circuit of FIG. 14.

FIG. 15 is a flowchart illustrating a process of a testing method in the semiconductor integrated circuit 400 of FIG. 14. An operation during a test of the semiconductor integrated circuit 400 will be described. In FIG. 15, steps S16, S26, S28 and S30 are similar to those of FIG. 5 and will not be described.

In step S412, a process of stopping output of a clock signal of the clock generating section 12 is performed. Specifically, the test mode terminal TMD is fixed to value 1, and value 0 is input to the clock control terminal CLCNT. As described with reference to FIG. 5, the clock generating section 12 stops output of a clock signal, and the value of the terminal CKOUT is fixed to 0.

The process of step S414 is substantially similar to that of step S14 of FIG. 5. Note that, when value 1 is input to the scan enable terminal SCEN, the AND gate 482 outputs 1, so that the selector 14 selects and outputs a test clock signal input to the test clock terminal TCL.

In step S418, the value of the scan enable terminal SCEN is set to be 0, so that the scan flip-flops 51 to 54 are switched to a capture operation. Thereby, the scan flip-flops 51 to 54 select and output the values of the respective terminals D. In this case, the output of the AND gate 482 is 0, so that the selector 14 selects and outputs a clock signal output by the clock generating section 12. Here, the value of the scan enable terminal SCEN is changed during a period when a test clock signal is 1.

Next, the value of the clock control terminal CLCNT is switched from 0 to 1. After the PLL 22 outputs two clock pulses from this time, two clock pulses are output from the clock generating section 12, and a capture operation is performed.

In step S420, value 1 is input as a test clock signal to the test clock terminal TCL. During the capture operation, since the signal of the test clock terminal TCL does not have an influence on the operation of the circuit, the timing of inputting a signal to the test clock terminal TCL in step S420 may be within a period when another clock signal (an output signal of the clock generating section 12, etc.) is 1.

The process of step S422 is substantially similar to that of step S22 of FIG. 5. Note that, when value 1 is input to the scan enable terminal SCEN, the AND gate 482 outputs 1, so that the selector 14 selects and outputs a test clock signal input to the test clock terminal TCL.

Further, the value of the clock control terminal CLCNT is switched to 0. The switching of the value of the clock control terminal CLCNT may be, in principle, performed at the same time as that of the switching of the scan enable terminal SCEN from 0 to 1. However, in order to prevent a clock signal output from the clock generating section 12 from falling before selection of the selector 14 is switched from the output of the clock generating section 12 to the test clock signal, the switching of the value of the clock control terminal CLCNT is performed after the switching of the scan enable terminal SCEN to value 1.

In step S424, value 0 is input as a test clock signal to the test clock terminal TCL after a time 6 has passed since the value of the scan enable terminal SCEN was set to be 1 and before a test clock signal is input to the scan path circuit so as to output a test result. In this case, a signal output from the selector 14 falls. By providing the time difference δ between the timing of setting the scan enable terminal SCEN to be 1 and the timing of a fall of a clock signal output from the selector 14, the flip-flop 74 in the gated clock circuit 70 can capture value 1 after a change at the scan enable terminal SCEN, so that the value of the terminal Q is changed to 1, thereby making it possible to input a shift clock to the scan flip-flop 53.

Since the selector 14 selects the test clock signal input to the test clock terminal TCL, the clock signal is used to successively output the values captured by the scan flip-flops 51 to 54 from the scan-out terminal SCO.

Figure 16:
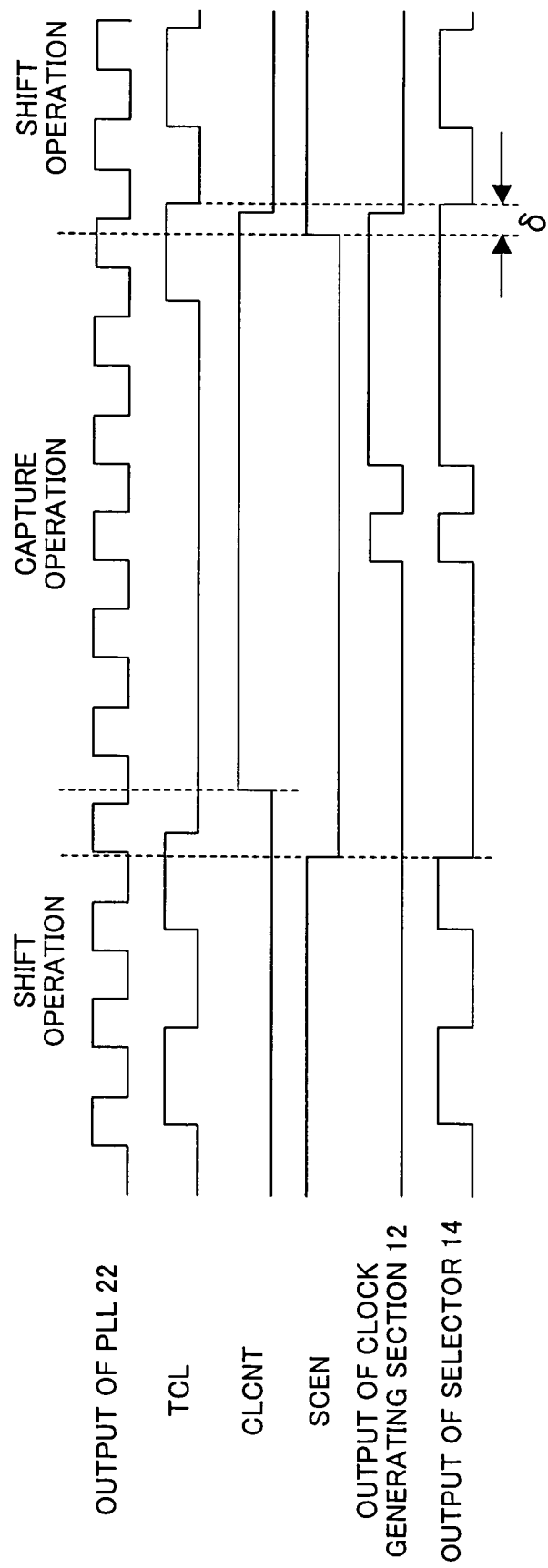
FIG. 16 is a timing diagram illustrating waveforms when the semiconductor integrated circuit of FIG. 14 performs a test in accordance with the flowchart of FIG. 15.

FIG. 16 is a timing diagram illustrating waveforms when the semiconductor integrated circuit 400 of FIG. 14 performs a test in accordance with the flowchart of FIG. 15. FIG. 16 illustrates the case where a signal change from 0 to 1 of the clock control terminal CLCNT is performed when a clock of the PLL 22 is 0. In this case, the timing with which the signal of the clock control terminal CLCNT is changed to 1 is not within a period when a clock of the PLL 22 is 1. Therefore, subsequently, after two pulses are output from the PLL 22, two pulses are output from the terminal CKOUT of the clock generating section 12.

Although the case where the timing with which the signal of the clock control terminal CLCNT is changed from 0 to 1, is within a period when a clock of the PLL 22 is 1, is not illustrated in FIG. 16, it can be clearly understood that two pulses are correctly output from the terminal CKOUT of the clock generating section 12 in this case, from the description of other embodiments.

Figure 17:
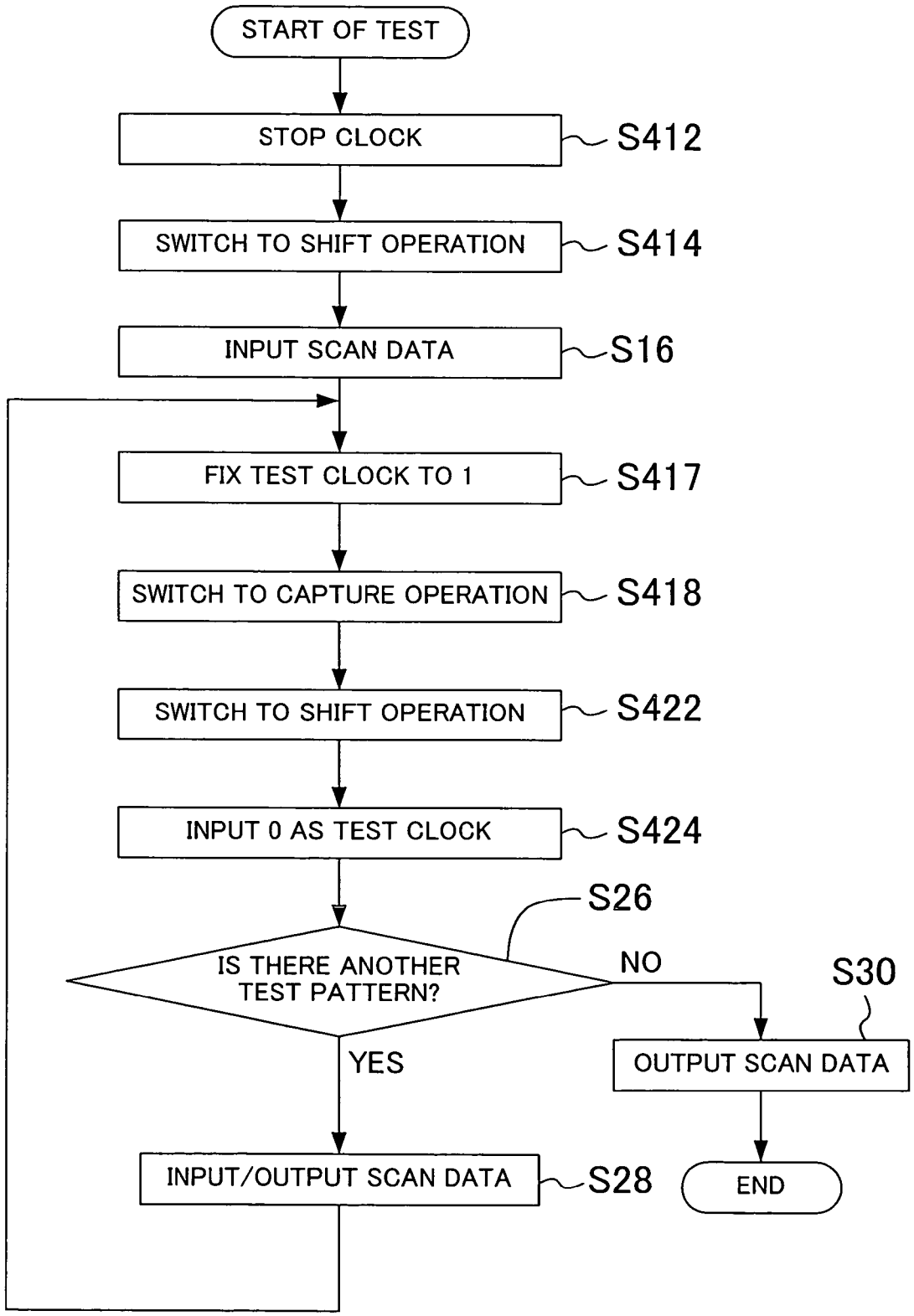
FIG. 17 is a flowchart illustrating another exemplary process of the testing method in the semiconductor integrated circuit of FIG. 14.

FIG. 17 is a flowchart illustrating another exemplary process of the testing method in the semiconductor integrated circuit 400 of FIG. 14. The testing method of FIG. 17 is the same as the testing method of FIG. 15, except that step S417 is further provided and step S420 is not provided.

Specifically, in FIG. 15, in step S420, the value of the test clock terminal TCL is caused to rise during a capture operation, and in step S424, after switching to a shift operation, the value of the test clock terminal TCL is caused to fall. In contrast to this, in FIG. 17, when a last clock pulse during a shift operation is input from the test clock terminal TCL, the clock signal is not caused to fall and is fixed to 1 without a modification (step S417), and in step S424, after switching to a shift operation, the value of the test clock terminal TCL is caused to fall. The other points of FIG. 17 are similar to those of FIG. 15.

Figure 18:
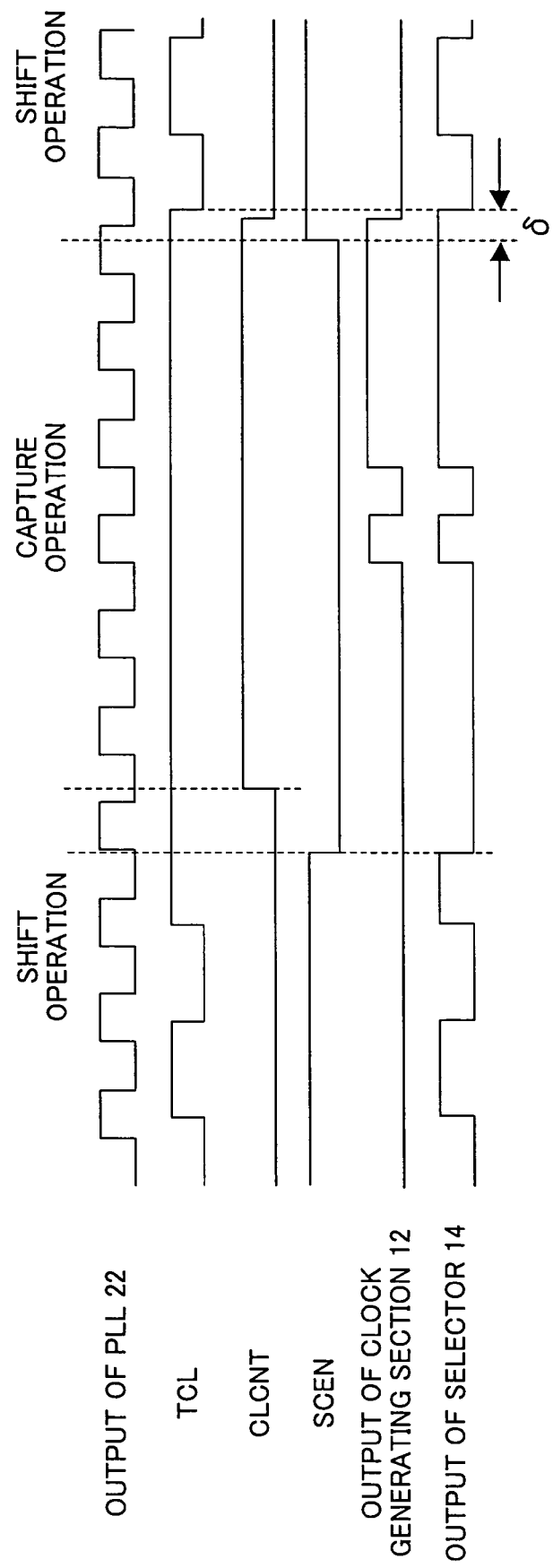
FIG. 18 is a timing diagram indicating waveforms when the semiconductor integrated circuit of FIG. 14 performs a test in accordance with the flowchart of FIG. 17.

FIG. 18 is a timing diagram indicating waveforms when the semiconductor integrated circuit 400 of FIG. 14 performs a test in accordance with the flowchart of FIG. 17. FIG. 18 illustrates the case where the signal of the clock control terminal CLCNT is changed from 0 to 1 when a clock of the PLL 22 is 0. In this case, the timing with which the signal of the clock control terminal CLCNT is changed to 1, is not within a period when a clock of the PLL 22 is 1, and therefore, subsequently, after two pulses are output from the PLL 22, two pulses are output from the terminal CKOUT of the clock generating section 12.

Also, when the timing with which the signal of the clock control terminal CLCNT is changed from 0 to 1, is within a period when a clock of the PLL 22 is 1, two pulses are similarly correctly output from the terminal CKOUT of the clock generating section 12.

In the semiconductor integrated circuit 400 of FIG. 14, when a capture operation is switched to a shift operation, the predetermined time difference δ can be provided between the timing of switching the value of the scan enable terminal SCEN and the timing of a fall of a clock signal output from the selector 14. Therefore, the flip-flop 74 of the gated clock circuit 70 can stably capture value 1 after a change at the scan enable terminal SCEN, and as a result, supply a shift clock to the scan flip-flop 53.

In other words, according to the semiconductor integrated circuit 400 of FIG. 14, even when the gated clock circuit 70 is included, a clock having an actual operating speed required for delay testing, which is generated by a PLL included in the semiconductor integrated circuit itself, can be used to reliably perform a scan test. Therefore, it is not necessary to use a high-speed tester for supplying a high-speed clock signal.

Fifth Embodiment

Figure 19:
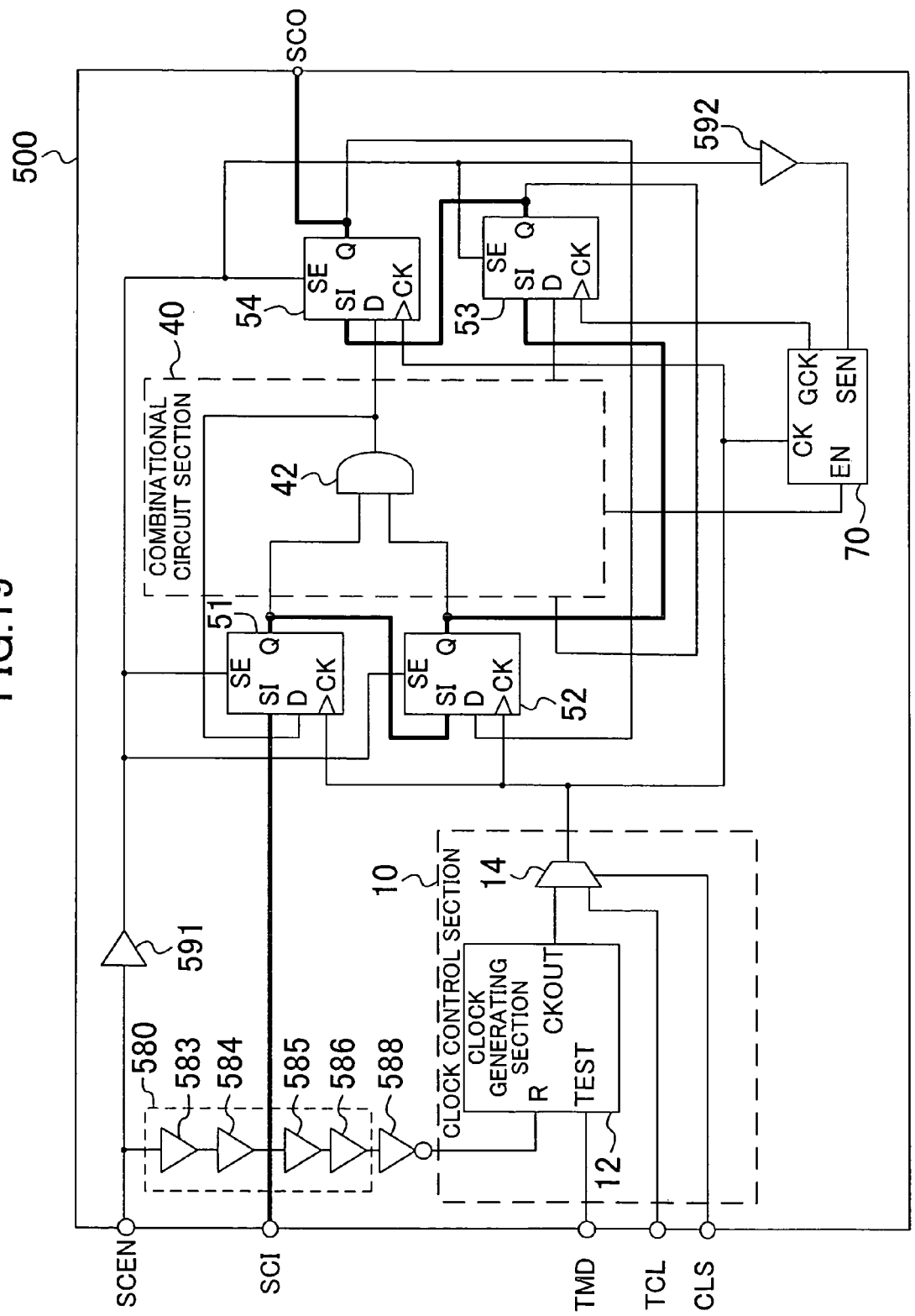
FIG. 19 is a block diagram illustrating a semiconductor integrated circuit according to a fifth embodiment of the present invention.

FIG. 19 is a block diagram illustrating a semiconductor integrated circuit according to a fifth embodiment of the present invention. The semiconductor integrated circuit 500 of FIG. 19 is the same as the semiconductor integrated circuit 100 of FIG. 1, except that a delay circuit 580, an inverter 588, and buffers 591 and 592 are further provided. The delay circuit 580 comprises buffers 583, 584, 585 and 586. The buffers 583 to 586 and the inverter 588 are connected in series.

The buffer 591 outputs a scan enable signal input to the scan enable terminal SCEN, to the scan flip-flops 51 to 54 and the buffer 592 without a modification. The buffer 592 outputs the input signal to the gated clock circuit 70 without a modification. The delay circuit 580 delays the scan enable signal and outputs the result to the inverter 588. The inverter 588 inverts the received signal and outputs the result to the clock generating section 12. Parts other than the delay circuit 580, the inverter 588, the buffers 591 and 592 are similar to those of the first embodiment and are indicated with the same reference numerals, and will not be described.

In this embodiment, a scan enable signal input to the scan enable terminal SCEN is used as an output command signal of a capture clock. Particularly, switching of the value of the scan enable signal to 0 corresponds to the output command signal.

Figure 20:
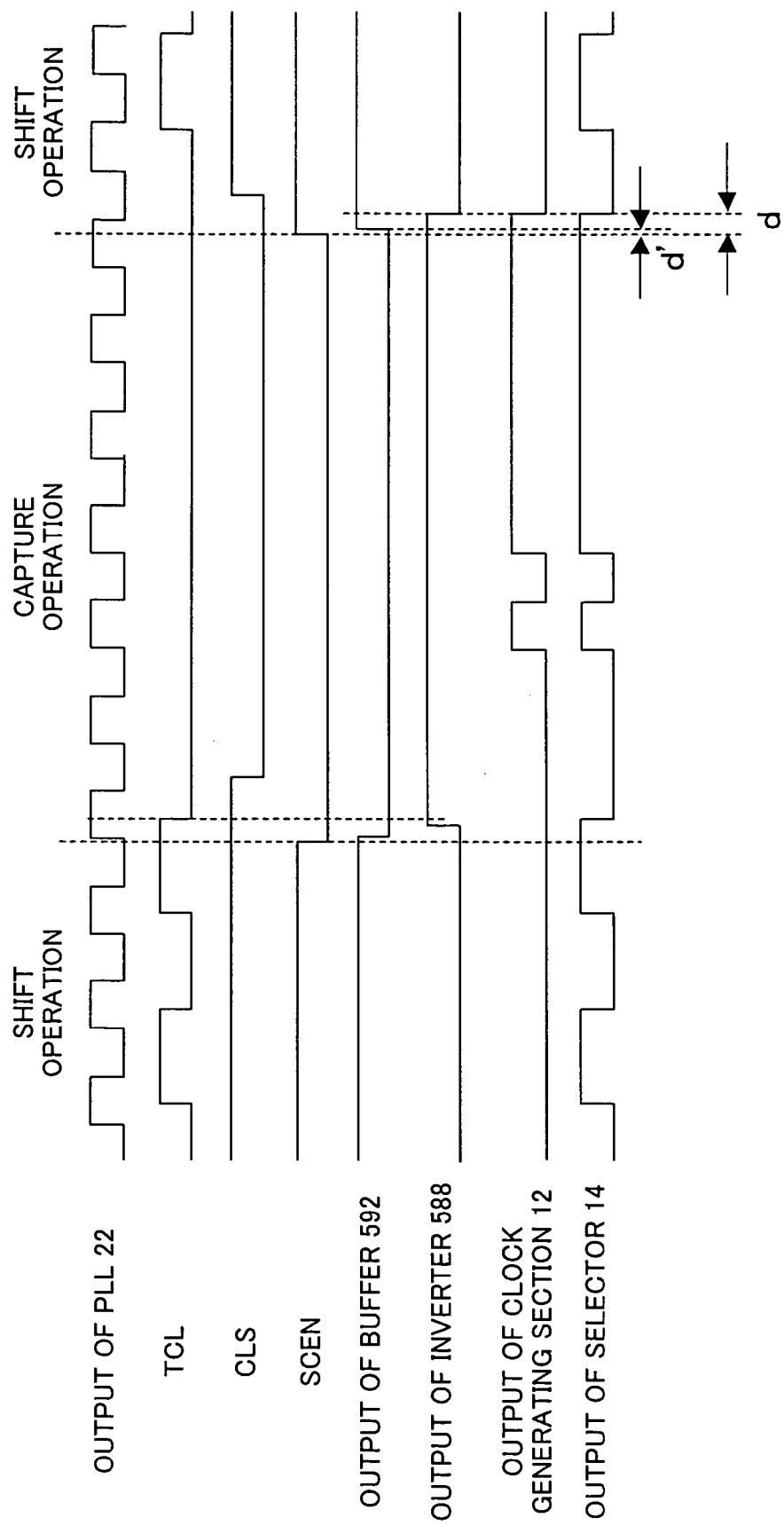
FIG. 20 is a timing diagram illustrating waveforms when the semiconductor integrated circuit of FIG. 19 is tested.

FIG. 20 is a timing diagram illustrating waveforms when the semiconductor integrated circuit 500 of FIG. 19 is tested. In FIG. 19, the scan enable terminal SCEN and the terminal R of the clock generating section 12 are connected together via the delay circuit 580. A delay caused by the delay circuit 580 is represented by d. On the other hand, the scan enable terminal SCEN and the terminal SEN of the gated clock circuit 70 are also connected together via the buffers 591 and 592. A delay caused by the buffers 591 and 592 is represented by d'. It is also assumed that d'<d.

When the value of the scan enable terminal SCEN is changed from 1 to 0, the change from 0 to 1 is propagated to the terminal R of the clock generating section 12 with the delay d, and the change serves as a trigger so that the clock generating section 12 outputs two pulses from the terminal CKOUT.

Next, when the value of the scan enable terminal SCEN is changed from 0 to 1, the change is propagated to the terminal SEN of the gated clock circuit 70 with the delay d'. On the other hand, the change is propagated to the terminal R of the clock generating section 12 with the delay d, so that the clock signal of the terminal CKOUT of the clock generating section 12 falls.

In this case, the flip-flop 74 of the gated clock circuit 70 can capture value 1 of the terminal SEN with a margin of (d-d'). Therefore, the gated clock circuit 70 can appropriately supply a clock to the scan flip-flop 53 during a shift operation.

According to the semiconductor integrated circuit 500 of FIG. 19, when a test is performed, a correct operation can be performed while the numbers of signals and input terminals required for a control can be reduced. In addition, it is not necessary to adjust, as in the semiconductor integrated circuit 400 of FIG. 14, the timing of a test clock signal input to the test clock terminal TCL, so that an operation is easy when a test is performed.

Figure 21:
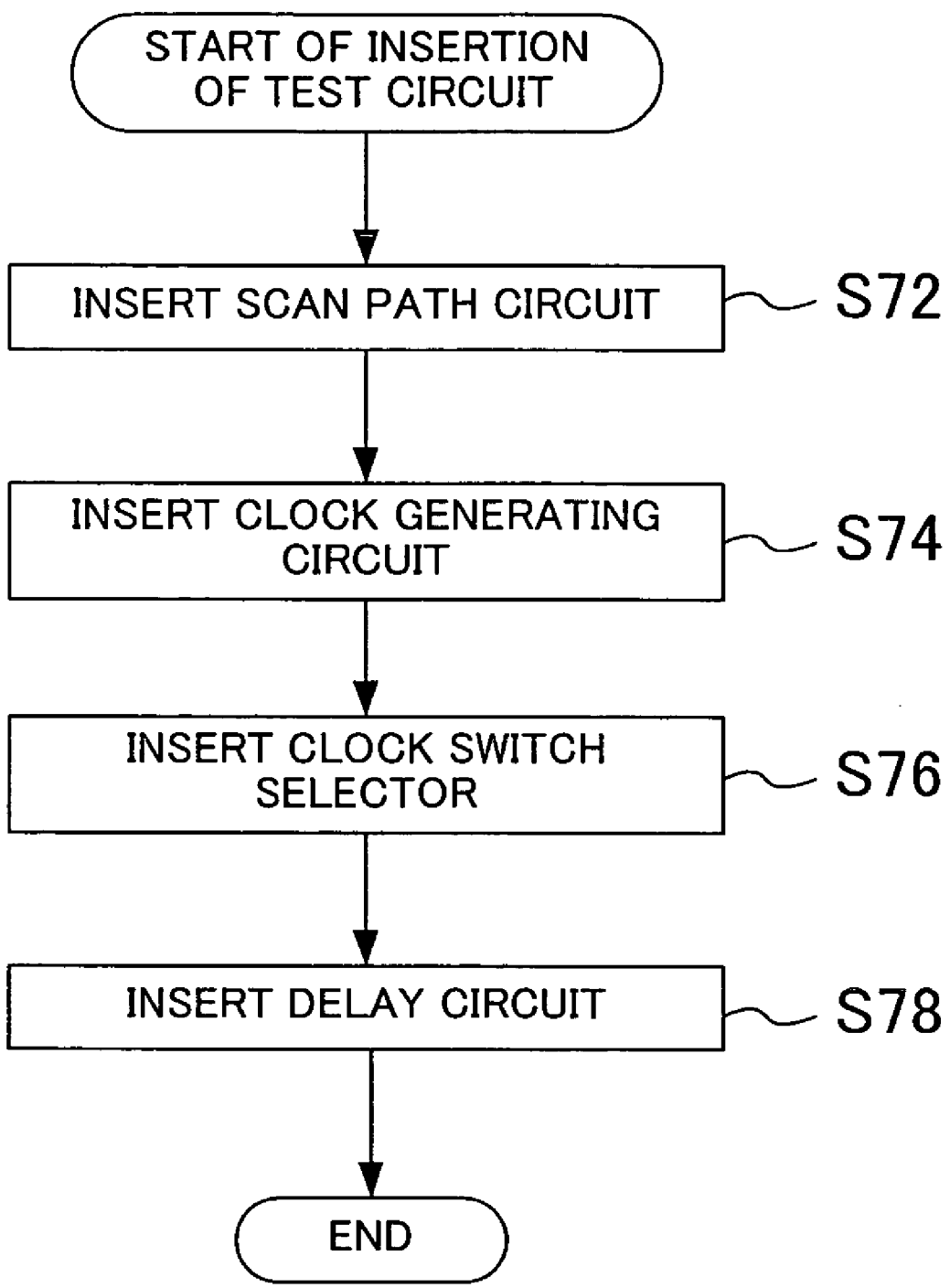
FIG. 21 is a flowchart illustrating a process of a method for designing the semiconductor integrated circuit of FIG. 19.
Figure 22:
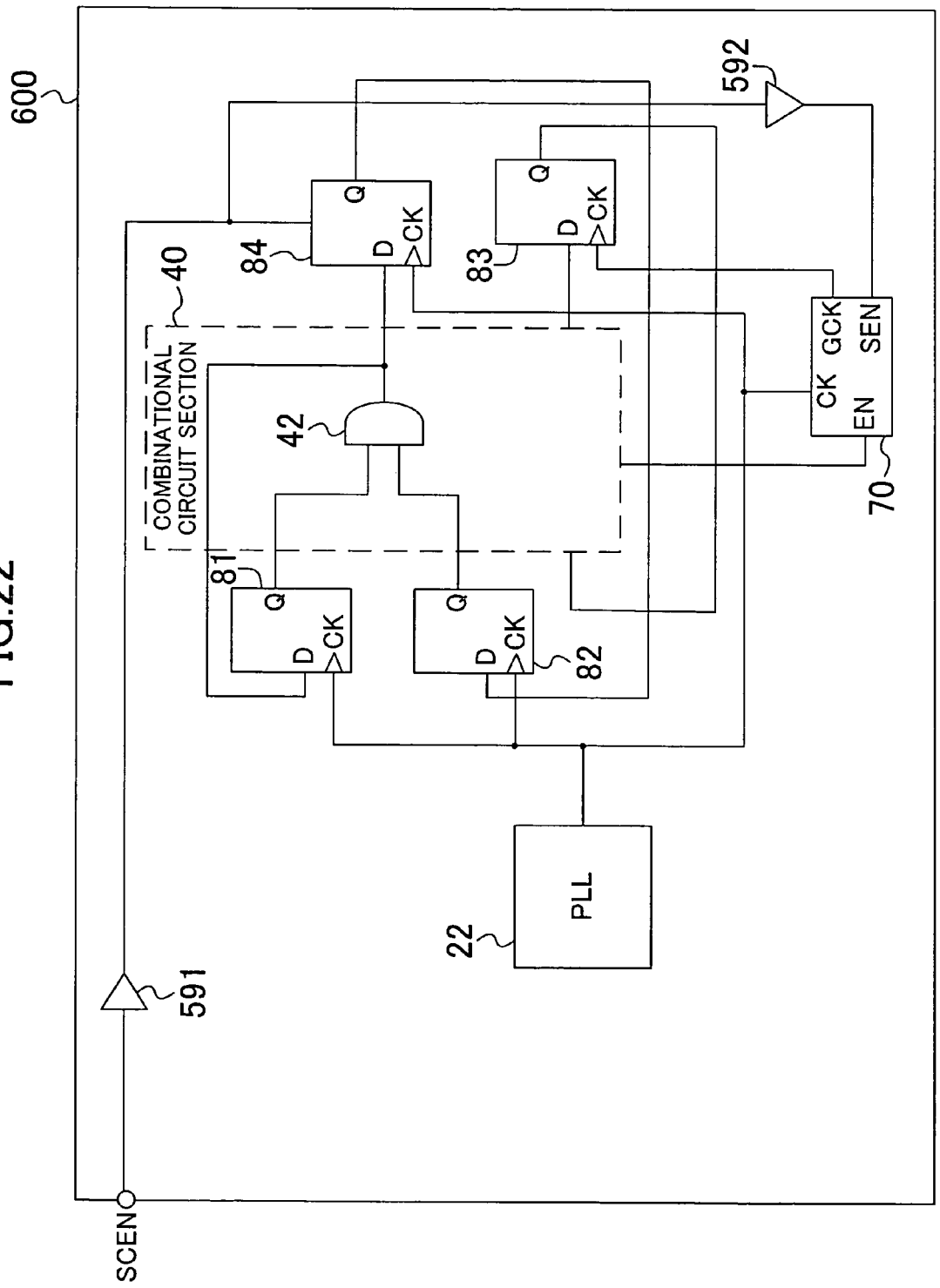
FIG. 22 is a block diagram illustrating a semiconductor integrated circuit which is a target of the designing method of FIG. 21.
Figure 23:
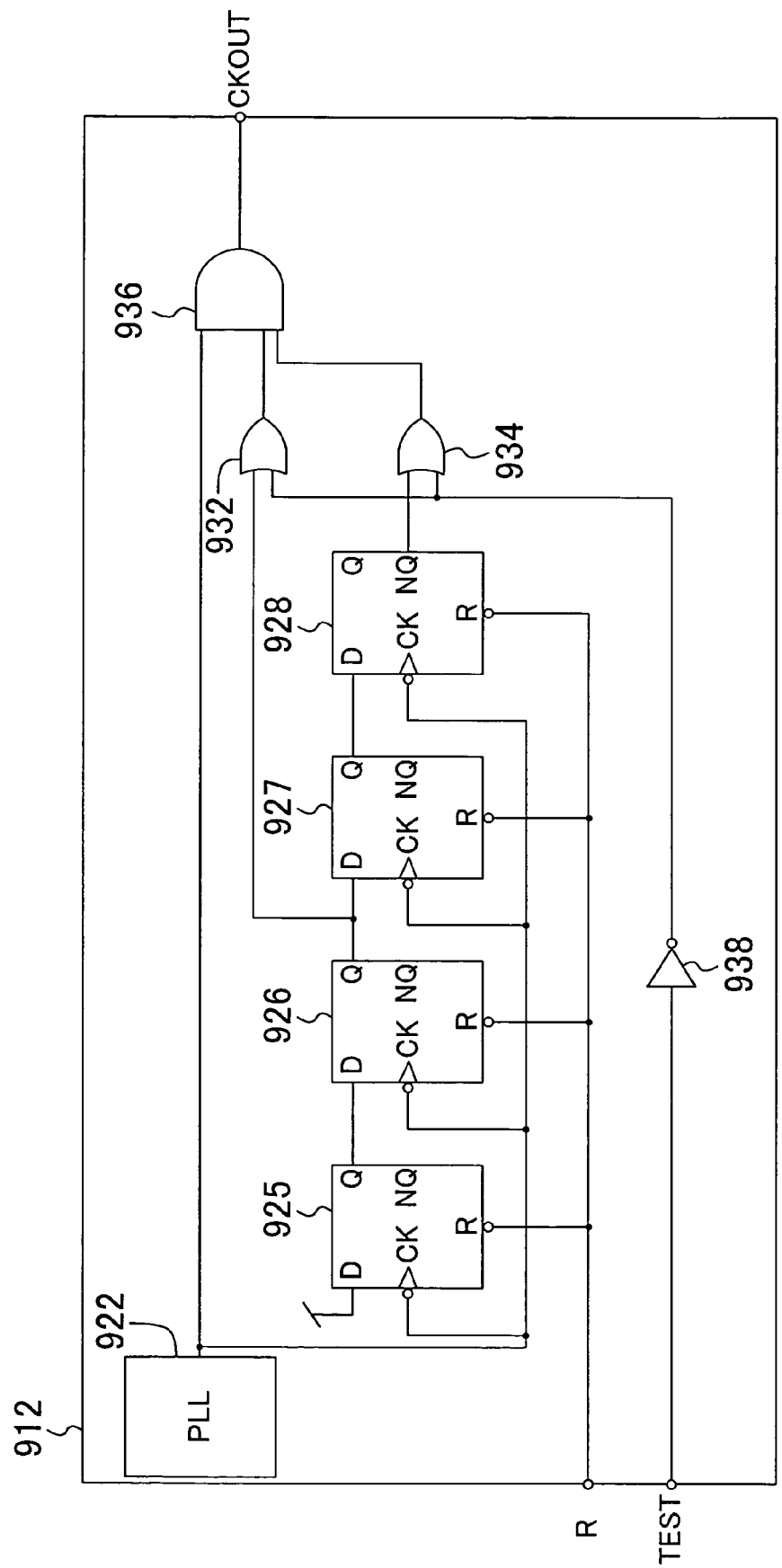
FIG. 23 is a block diagram illustrating a configuration of a conventional clock generating section.
Figure 24:
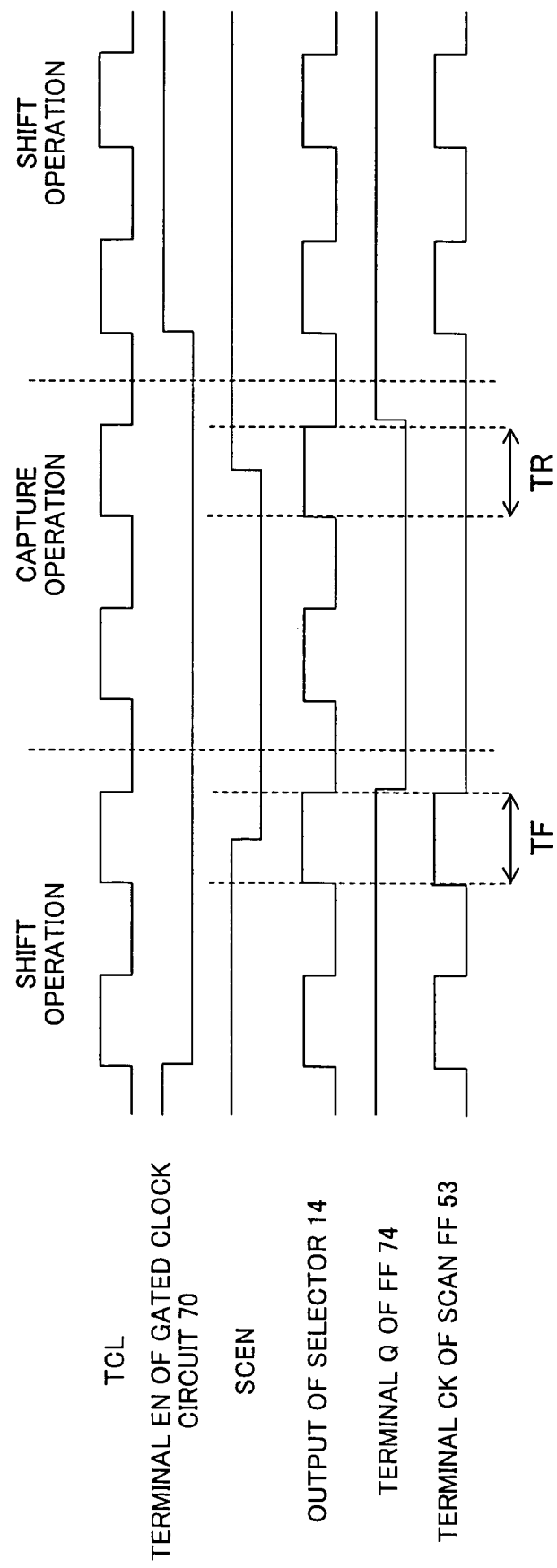
FIG. 24 is a timing diagram illustrating waveforms during a test of the conventional semiconductor integrated circuit, indicating the case where a requirement for the signal change timing of a scan enable terminal SCEN is satisfied.

Next, a method for designing the semiconductor integrated circuit 500 of FIG. 19 will be described. FIG. 21 is a flowchart illustrating a process of the method for designing the semiconductor integrated circuit 500 of FIG. 19. FIG. 22 is a block diagram illustrating a semiconductor integrated circuit 600 which is a target of the designing method of FIG. 21. The semiconductor integrated circuit 600 of FIG. 22 comprises a PLL 22, a combinational circuit section 40, a gated clock circuit 70, flip-flops 81, 82, 83 and 84, and buffers 591 and 592.

Initially, a process of designing the semiconductor integrated circuit 600 of FIG. 22 is performed, and thereafter, the process of FIG. 21 is performed. In scan path circuit inserting step S72 of FIG. 21, a scan path circuit composed of the scan flip-flops 51 to 54 is inserted into the semiconductor integrated circuit 600.

This step includes a sub-step of replacing flip-flops 81 to 84 with the scan flip-flops 51 to 54, respectively, a sub-step of inserting a scan-in terminal SCI and a scan-out terminal SCO, a sub-step of providing connections so as to create a scan data path of the scan-in terminal SCI→ the scan flip-flop 51→ the scan flip-flop 52→ the scan flip-flop 53→ the scan flip-flop 54→ the scan-out terminal SCO, and a sub-step of providing a connection between the scan enable terminal SCEN and the terminals SE of the scan flip-flops 51 to 54.

In a clock generating section inserting step S74, a clock generating section 12 and an inverter 588 are inserted instead of the PLL 22. Further, the terminal R of the clock generating section 12 is connected via the inverter 588 to the scan enable terminal SCEN, and the terminal TEST of the clock generating section 12 is connected to the test mode terminal TMD.

In a selector inserting step S76, a selector 14 for switching a clock is inserted. Further, the terminal CKOUT of the clock generating section 12 and the test clock terminal TCL are connected to the two input terminals of the selector 14, respectively, and the clock switch terminal CLS is connected to a terminal of the selector 14 which receives a select signal.

In a delay circuit inserting step S78, a delay circuit 580 is inserted into a path from the scan enable terminal SCEN to the terminal R of the clock generating section 12. In this case, the number of buffers (here, two) which have already been present between the scan enable terminal SCEN and the terminal SEN of the gated clock circuit 70 is taken into consideration, and a larger number of buffers than that are inserted as the delay circuit 580. Here, as an example, four buffers 583 to 586 are inserted. By the above-described process, the semiconductor integrated circuit 500 of FIG. 19 can be obtained.

In each step of FIG. 21, data representing a circuit element, such as a scan flip-flop or the like, is supplied from a memory (not shown), and obtained data of the semiconductor integrated circuit 500 is written into the memory.

According to the semiconductor integrated circuit designing method of FIG. 21, a delay element (buffer) is inserted, taking it into consideration that a signal input from the scan enable terminal SCEN needs to be propagated to the terminal R of the clock generating section 12 later than to the terminal SEN of the gated clock circuit 70, thereby making it possible to correctly generate a semiconductor integrated circuit which is correctly operated as in FIG. 19.

Although a buffer is used as an exemplary delay element in this embodiment, other combinational circuit elements, such as an inverter, an AND gate, an OR gate, and the like, may be used.

Steps S72, S74 and S76 are not always essential processes. Specifically, the process of step S78 may be performed with respect to a semiconductor integrated circuit which already includes a scan chain circuit, a clock generating section, a clock switching circuit, and the like after a design is performed using other means (e.g., manual design using a commercially available EDA tool, a circuit diagram input, or the like, etc.).

Note that, in the first, third to fifth embodiments, the same flip-flop as the flip-flop 26 may be further provided, and may be connected in series between the flip-flop 25 and the flip-flop 26. In this case, a period after the value of the clock control terminal CLCNT is changed from 0 to 1, a clock pulse is input to the test clock terminal TCL, or the value of a scan enable signal is changed from 1 to 0, and until a clock is started to be output from the clock generating section, can be elongated.

Similarly, by changing the number of flip-flops connected in series between the flip-flop 25 and the flip-flop 26, a period until a clock is started to be output from the clock generating section 12 can be arbitrarily adjusted.

Although it has been described in each of the above embodiments that the number of clock pulses is two in the normal operating mode when a test is performed, the same flip-flop as the flip-flop 27 may be further provided, and may be connected in series between the flip-flop 27 and the flip-flop 28. In this case, the number of clock pulses can be three in the normal operating mode when a test is performed, so that delay testing which requires three clock pulses can be performed in the normal operating mode when a test is performed.

Similarly, by connecting a larger number of flip-flops in series between the flip-flop 27 and the flip-flop 28, the number of clock pulses can be arbitrarily changed in the normal operating mode. Also, conversely, by removing the flip-flop 27, the number of clock pulses can be one during a capture operation. Therefore, by an operation similar to that of this embodiment, a scan test can be easily performed with respect to a general stuck-at fault.

Although it has also been described in each of the above embodiments that the scan flip-flops 51 to 54 are operated in a rise of a clock, these scan flip-flops may be operated in synchronization with a fall of a clock. In this case, the flip-flops 25 to 28 and 74 may be caused to be operated in synchronization with the opposite edge of a clock (i.e., the flip-flops 25 to 27 and 74 are operated in synchronization with a rise of a clock, and the flip-flop 28 is operated in synchronization with a fall of a clock), thereby making it possible to obtain a similar effect.

Although it has also been described in each of the above embodiments that a PLL is included as an example, other oscillator circuits (e.g., a Delay Locked Loop (DLL)), or other clock signal generating circuits (e.g., a frequency multiplier or a frequency divider which receives an oscillating signal from the outside of a semiconductor integrated circuit and generates a clock signal based on the oscillating signal) may be provided instead of the PLL.

Although it has also been described in each of the above embodiments, assuming that the semiconductor integrated circuit includes a gated clock circuit, an operation can be 20 correctly performed even when the semiconductor integrated circuit does not include a gated clock circuit. Therefore, the semiconductor integrated circuit of the present invention does not necessarily need to have a gated clock circuit.

As described above, the present invention can employ a clock generated in a semiconductor integrated circuit when delay testing is performed, and therefore, is useful 25 for a semiconductor integrated circuit which requires a test in which a clock having an actual operating speed is used.

What is claimed is:

1. A semiconductor integrated circuit comprising:
a combinational circuit section having a combinational circuit;
a clock control section for generating and outputting a predetermined number of pulses as a first clock signal after a predetermined period has passed since a time when a change in a scan enable signal was received;

a clock stop control circuit for controlling an enable state and a disable state of the first clock signal based on the scan enable signal, and for outputting a controlled clock signal as a second clock signal; and a scan path circuit for inputting and outputting a value from and to the combinational circuit section in accordance with a scan enable signal and in synchronization with the first and the second clock signals, wherein the clock control section has an oscillator circuit for generating and outputting the pulses, and is configured to output a last pulse of the predetermined number of pulses in a manner which holds a logical value immediately after an active edge of the last pulse.

2. The semiconductor integrated circuit of claim 1, wherein the clock control section causes a trailing edge of the last pulse to change after the change in the scan enable signal.

3. The semiconductor integrated circuit of claim 2, wherein the clock stop control circuit has a flip-flop for latching and outputting a value corresponding to the scan enable signal in synchronization with an edge of a pulse of the first clock signal, the edge being opposite to an edge which the scan path circuit synchronizes with, and outputs the first clock signal to the scan path circuit in accordance with the output of the flip-flop.

4. The semiconductor integrated circuit of claim 3, wherein the clock control section has a selection section for selecting and outputting one of a test clock signal input from the outside of the semiconductor integrated circuit and the first clock signal.

5. The semiconductor integrated circuit of claim 4, wherein the selection section performs selection in accordance with a select signal, and the select signal is generated using at least the scan enable signal.

6. The semiconductor integrated circuit of claim 1, wherein the clock control section has a period control circuit for controlling a length of a period after a time when the output command signal is received and until start of output of the first clock signal.

7. The semiconductor integrated circuit of claim 6, wherein the period control circuit has a counter for counting the number of pulses of an input signal, and when a count value of the counter reaches a predetermined value, outputs a signal indicating that the counter value has reached the predetermined value.

8. The semiconductor integrated circuit of claim 7, wherein the period control circuit further has a shift register for holding and outputting a set value, and uses the value of the shift register as the predetermined value.

9. The semiconductor integrated circuit of claim 1, wherein the clock control section uses the scan enable signal as the output command signal.

10. The semiconductor integrated circuit of claim 9, further comprising:

a clock stop control circuit for outputting the first clock signal to the scan path circuit in accordance with the scan enable signal; and a delay circuit for delaying and outputting the scan enable signal so that the scan enable signal reaches the clock control section later than the scan enable signal reaches the clock stop control circuit.

11. The semiconductor integrated circuit of claim 10, wherein the delay circuit has a combinational circuit element, and the number of the combinational circuit elements is larger than the number of combinational circuits provided on a signal path until the scan enable signal reaches the clock stop control circuit.

12. The semiconductor integrated circuit of claim 1, wherein the output command signal is input from the outside of the semiconductor integrated circuit.

13. The semiconductor integrated circuit of claim 1, wherein the clock control section comprises a flip-flop which is operated in synchronization with a test clock signal input from the outside of the semiconductor integrated circuit, and uses the test clock signal as the output command signal.

14. A semiconductor integrated circuit designing method comprising the steps of:

designing a semiconductor integrated circuit having
a combinational circuit section having a combinational circuit,
a clock control section for generating and outputting a predetermined number of pulses as a first clock signal after a predetermined period has passed since a time when a change in a scan enable signal was received,
a clock stop control circuit for controlling an enable state and a disable state of the first clock signal based on the scan enable signal, and for outputting a controlled clock signal as a second clock signal, and
a scan path circuit for inputting and outputting a value from and to the combinational circuit section in accordance with a scan enable signal and in synchronization with the first and the second clock signals,
where the clock control section has an oscillator circuit for generating and outputting the pulses, and is configured to output a last pulse of the predetermined number of pulses in a manner which holds a logical value immediately after an active edge of the last pulse; and inserting a delay circuit for delaying the scan enable signal so that a change in the scan enable signal reaches the clock control section later than the change in the scan enable signal reaches the clock stop control circuit.

15. The semiconductor integrated circuit designing method of claim 14, wherein the delay circuit has a combinational circuit element, and the number of the combinational circuit elements is larger than the number of combinational circuits provided on a signal path until the scan enable signal reaches the clock stop control circuit.

16. The semiconductor integrated circuit designing method of claim 14, further comprising:

inserting a scan path circuit for inputting and outputting a value from and to the combinational circuit section in synchronization with the first clock signal.

17. The semiconductor integrated circuit designing method of claim 16, further comprising:

inserting a selection section for selecting and outputting one of a test clock signal input from the outside of the semiconductor integrated circuit and the clock signal output from the clock generating section.

* * * * *